(12) United States Patent
Senkovskyy et al.

(10) Patent No.: US 12,484,431 B2
(45) Date of Patent: Nov. 25, 2025

(54) METHOD FOR PREPARING AN ORGANIC SEMICONDUCTING LAYER, A COMPOSITION FOR USE THEREIN AND AN ORGANIC ELECTRONIC DEVICE

(71) Applicant: Novaled GmbH, Dresden (DE)

(72) Inventors: Volodymyr Senkovskyy, Dresden (DE); Pierre Seidenglanz, Dresden (DE); Peter Robaschik, Dresden (DE); Ulrich Denker, Dresden (DE); Stefan Zott, Dresden (DE); Anne Fadhel, Dresden (DE); Martin Ammann, Dresden (DE); Regina Luschtinetz, Dresden (DE)

(73) Assignee: Novaled GmbH, Dresden (DE)

( * ) Notice: Subject to any disclaimer, the term of this patent is extended or adjusted under 35 U.S.C. 154(b) by 1040 days.

(21) Appl. No.: 17/428,793

(22) PCT Filed: Feb. 5, 2020

(86) PCT No.: PCT/EP2020/052850
§ 371 (c)(1),
(2) Date: Aug. 5, 2021

(87) PCT Pub. No.: WO2020/161180
PCT Pub. Date: Aug. 13, 2020

(65) Prior Publication Data
US 2022/0131115 A1 Apr. 28, 2022

(30) Foreign Application Priority Data

Feb. 6, 2019 (EP) .................................. 19155731

(51) Int. Cl.
*H10K 71/16* (2023.01)
*C07C 13/66* (2006.01)
(Continued)

(52) U.S. Cl.
CPC ........... *H10K 71/164* (2023.02); *C07C 13/66* (2013.01); *C07C 15/28* (2013.01); *C07D 221/18* (2013.01);
(Continued)

(58) Field of Classification Search
None
See application file for complete search history.

(56) References Cited

U.S. PATENT DOCUMENTS 10,937,966 B2 * 3/2021 Runge .................. H10K 71/164
11,502,258 B2 * 11/2022 Senkovskyy ...... H10K 85/6574
(Continued)

FOREIGN PATENT DOCUMENTS

CN 107978684 A 5/2018
CN 108701773 A * 10/2018 ........... C07C 251/24
(Continued)

OTHER PUBLICATIONS

Hyunkoo Lee et al. "Enhanced performances in inverted bottom-emission organic light-emitting diodes with KBH4-doped electron injection layer", Phys. Status Solidi A 2014, vol. 211, p. 1807-1811 (Year: 2014).*

(Continued)

*Primary Examiner* — Kevin M Bernatz
(74) *Attorney, Agent, or Firm* — Eversheds Sutherland (US) LLP

(57) ABSTRACT

The present invention relates to a method for preparing an organic semiconducting layer comprising the steps: a) providing a first composition in a first vacuum thermal evaporation source, the first composition comprising aa) a first organic compound, the first organic compound comprising at least one unsubstituted or substituted $C_{10}$-$C_{30}$ condensed aryl group and/or at least one unsubstituted or substituted $C_3$-$C_{30}$ heteroaryl group, wherein the one or more substitu- (Continued)

ent(s) if present, are selected from the group consisting of (i) deuterium, (ii) a halogen, (iii) a $C_1$ to $C_{22}$ silyl group, (iv) a $C_1$ to $C_{30}$ alkyl group, (v) a C to $C_{10}$ alkylsilyl group, (vi) a $C_6$ to $C_{22}$ arylsilyl group, (vii) a $C_3$ to $C_{30}$ cycloalkyl group, (viii) a $C_2$ to $C_{30}$ heterocycloalkyl group, (ix) a $C_6$ to $C_{30}$ aiyl group, (x) a $C_2$ to $C_{30}$ heteroaryl group, (xi) a $C_1$ to $C_{30}$ perfluoro-hydrocarbyl group, or (xii) a $C_1$ to $C_{10}$ trifluoroalkyl group, wherein the first organic compound has i) a dipole moment in the range of $\geq 0$ and $\leq 2$ Debye; and ii) a molecular weight in the range of $\geq 400$ and $\leq 1,800$; and bb) a metal borate compound; b) transferring the first composition from the solid phase into the gas phase in a vacuum chamber; and c) depositing the first composition on a substrate to form the organic semiconducting layer; a composition for use therein, and an organic electronic device prepared this way.

20 Claims, 3 Drawing Sheets

(51) Int. Cl.

| | |
|---|---|
| *C07C 15/28* | (2006.01) |
| *C07D 221/18* | (2006.01) |
| *C07D 251/24* | (2006.01) |
| *C07D 307/91* | (2006.01) |
| *C07D 405/04* | (2006.01) |
| *C07D 405/10* | (2006.01) |
| *C07D 409/04* | (2006.01) |
| *C09K 11/06* | (2006.01) |
| *H10K 85/30* | (2023.01) |
| *H10K 85/60* | (2023.01) |

(52) U.S. Cl.
CPC ......... *C07D 251/24* (2013.01); *C07D 307/91* (2013.01); *C07D 405/04* (2013.01); *C07D 405/10* (2013.01); *C07D 409/04* (2013.01); *C09K 11/06* (2013.01); *H10K 85/615* (2023.02); *H10K 85/623* (2023.02); *H10K 85/626* (2023.02); *H10K 85/654* (2023.02); *H10K 85/6572* (2023.02); *H10K 85/6574* (2023.02); *H10K 85/6576* (2023.02); *C07C 2603/24* (2017.05); *C07C 2603/40* (2017.05); *C09K 2211/1007* (2013.01); *C09K 2211/1011* (2013.01); *C09K 2211/1018* (2013.01); *H10K 85/322* (2023.02)

(56) References Cited

U.S. PATENT DOCUMENTS

| | | | |
|---|---|---|---|
| 11,532,801 B2* | 12/2022 | Pavicic | C07D 239/70 |
| 2004/0232409 A1* | 11/2004 | Igarashi | H10K 85/624 257/40 |
| 2005/0025993 A1 | 2/2005 | Thompson et al. | |
| 2016/0099422 A1 | 4/2016 | Zeng et al. | |
| 2018/0114920 A1 | 4/2018 | Frey et al. | |
| 2018/0114921 A1* | 4/2018 | Rothe | H10K 50/165 |
| 2021/0036230 A1* | 2/2021 | Frey | C07D 213/16 |
| 2023/0270004 A1* | 8/2023 | Werner | H10K 85/654 257/40 |

FOREIGN PATENT DOCUMENTS

| | | | | |
|---|---|---|---|---|
| CN | 109216571 A | | 1/2019 | |
| CN | 109314191 A | | 2/2019 | |
| EP | 3291319 A1 | * | 3/2018 | ......... H01L 51/0001 |
| EP | 3312895 A1 | * | 4/2018 | ........... C07D 221/18 |
| EP | 3355378 A1 | | 8/2018 | |
| EP | 3406599 A1 | | 11/2018 | |
| EP | 3407401 A1 | | 11/2018 | |
| WO | WO-2009054253 A1 | * | 4/2009 | ........... C07D 213/36 |
| WO | 2014075300 A1 | | 5/2014 | |
| WO | WO-2017140780 A1 | * | 8/2017 | ........... C07C 251/24 |
| WO | 2018041864 A1 | | 3/2018 | |

OTHER PUBLICATIONS

Office Action issued in Korean application No. 10-2021-7028377 dated Feb. 13, 2025 (11 pages).
Communication pursuant to Article 94(3) EPC issued in European application No. 19155731.3, dated Dec. 11, 2023 (6 pages).
Communication pursuant to Article 94(3) EPC issued in European application No. 19155731.3, dated Jul. 11, 2024 (6 pages).
PCT International Search Report and Written Opinion for PCT Application No. PCT/EP2020/052850 mailed Apr. 14, 2020 (12 pages).
Notification of First Office Action issued in Chinese application No. 202080019064.X, dated Dec. 28, 2023 (24 pages).

* cited by examiner

METHOD FOR PREPARING AN ORGANIC SEMICONDUCTING LAYER, A COMPOSITION FOR USE THEREIN AND AN ORGANIC ELECTRONIC DEVICE

CROSS REFERENCE TO RELATED APPLICATIONS

This application is a U.S. national phase application of PCT/EP2020/052850, filed Feb. 5, 2020, which claims priority to European Application No. 19155731.3, filed Feb. 6, 2019. The content of these applications is incorporated herein by reference.

The present invention relates to a method for preparing an organic semiconducting layer and a composition for use in the method. The invention further relates to an organic electronic device which is obtainable by a sequence of steps including the method.

BACKGROUND ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

Organic electronic devices typically comprise a substrate and several organic semiconducting layers. These may be prepared by evaporating the different compounds from vacuum thermal evaporation (VTE) sources and depositing them on the substrate to form the organic semiconducting layers. During mass production of semiconducting layers, typically the VTE sources move back and forth under the substrate which is to be coated, see for example KR20150080213. If two compounds are evaporated from separate sources, the lateral uniformity may be poor, as first one and then the other compound is deposited. This may lead to reduced performance and/or stability. In particular, a layer consisting of metal organic complex may suffer from poor performance.

A method for preparing an organic semiconducting layer using a composition comprising at least two compounds and sublimating the same from a single vacuum thermal evaporation source is known from WO 2018/041864 A1.

However, there is still a need to further improve methods for preparing organic semiconducting layers for use in organic electronic devices, such as OLEDs.

Additionally, there is still a need to provide compositions for preparing organic semiconducting layers which have improved thermal properties compared to the state of the art, for example improved heat conductivity in the VTE source.

It is, therefore, an object of the present invention to provide a novel method for preparing an organic semiconducting layer overcoming drawbacks of the prior art, in particular a method suitable to prepare a homogeneous organic semiconducting layer comprising at least two compounds which has beneficial thermal properties. That is, it is one aim of the present invention to provide a method for preparing an organic semiconducting layer comprising at least two compounds in which the different compounds are homogeneously mixed with each other in the resultant organic semiconducting layer.

Another aim of the present invention is to provide a composition which has improved thermal properties, in particular for evaporation from a VTE source.

SUMMARY OF THE INVENTION

The above object is achieved by a method for preparing an organic semiconducting layer comprising the steps:
a) Providing a first composition in a first vacuum thermal evaporation source, the first composition comprising
  aa) a first organic compound, the first organic compound comprising at least one unsubstituted or substituted $C_{10}$ to $C_{30}$ condensed aryl group and/or at least one unsubstituted or substituted $C_3$ to $C_{30}$ heteroaryl group, wherein the one or more substituent(s) if present, are independently selected from the group consisting of (i) deuterium, (ii) halogen, (iii) a $C_1$ to $C_{22}$ silyl group, (iv) a $C_1$ to $C_{30}$ alkyl group, (v) a $C_1$ to $C_{10}$ alkylsilyl group, (vi) a $C_6$ to $C_{22}$ arylsilyl group, (vii) a $C_3$ to $C_{30}$ cycloalkyl group, (viii) a $C_2$ to $C_{30}$ heterocycloalkyl group, (ix) a $C_0$ to $C_{30}$ aryl group, (x) a $C_2$ to $C_{30}$ heteroaryl group, (xi) a $C_1$ to $C_{30}$ perfluoro-hydrocarbyl group, or (xii) a $C_1$ to $C_{10}$ trifluoroalkyl group, wherein the first organic compound has
    i) a dipole moment in the range of $\geq 0$ and $\leq 2$ Debye; and
    ii) a molecular weight in the range of $\geq 400$ and $\leq 1{,}800$; and
  bb) a metal borate compound;
b) Transferring the first composition from the solid phase into the gas phase in a vacuum chamber; and
c) Depositing the first composition to form the organic semiconducting layer.

Surprisingly, it was found by the inventors that the above method provides the possibility to provide an organic semiconducting layer in which the first organic compound and the metal borate compound are homogeneously mixed with each other, i.e. to provide a method in which the formation of a layer consisting of metal borate compound is avoided.

Additionally, it was found that the conductivity of the organic semiconducting layer formed by the method according to invention is significantly improved compared to a layer consisting of a metal borate compound. Thereby, lower operating voltage and longer battery life can be obtained, in particular in mobile electronic devices.

Furthermore, it was found that the first composition can be transferred from the solid phase into the gas phase without significant decomposition, if the first organic compound has a dipole moment in the range of $\geq 0$ and $\leq 2$ Debye. In particular, it was found that no significant decomposition occurs even if the first composition is partially or fully melted before or during transfer of the first composition into the gas phase. Without being bound by theory, it is believed that a composition which is at least partially melted in the VTE source may have improved heat conductivity compared to a composition which does not melt in the VTE source during fabrication of devices. Thereby, heat distribution in the VTE source may be improved.

The vacuum thermal evaporation source may also be described as VTE source, thermal evapo-ration source, evaporator deposition source, nozzle source, shower head source, VTE cell, thermal evaporation cell, evaporation cell or sublimation cell. The vacuum thermal evaporation source is arranged inside the vacuum chamber.

The VTE source comprises a receptacle for the composition, a heating element to heat the receptacle and at least one thermocouple to determine the temperature of the receptacle. The receptacle may be a crucible. The receptacle consists of inert material, for example $Al_2O_3$ or Ti. Additionally, the VTE source may comprise a cover with openings for releasing the composition in the gas phase into the vacuum chamber, for example nozzles. The cover may be heated to reduce risk of clogging of the openings or nozzles.

The VTE source may move back and forth or rotate underneath the substrate. Alternatively, the VTE source may be stationary and the substrate may move above the source.

In the context of the present invention, the term "evaporation" denotes the transfer of a compound or composition from the solid phase into the gas phase, irrespective of any phase change at elevated temperature.

In the context of the present invention, the term "vacuum chamber" means the location wherein the transfer of the first composition from the solid phase into the gas phase takes place. Subsequent deposition of the first composition on a solid support also takes place in the vacuum chamber. The vacuum chamber is made from metal or other mechanically stable material and can be evacuated to generate a vacuum in the vacuum chamber. The vacuum chamber may also be described as deposition chamber, process chamber, sublimation chamber or evaporation chamber.

The pressure in the vacuum chamber in step b) may be in the range of 10-2 to 10-9 mbar, also preferred 10-3 to 10-8 mbar. Transfer of the first composition from the solid phase into the gas phase can be well achieved at this pressure.

The dipole moment $|\vec{\mu}|$ of a molecule containing N atoms is given by:

$$\vec{\mu} = \sum_i^N q_i \vec{r}_i$$

$$|\vec{\mu}| = \sqrt{\mu_x^2 + \mu_y^2 + \mu_z^2}$$

where $q_i$ and $\vec{r}_i$ are the partial charge and position of atom i in the molecule.

The dipole moment is determined by a semi-empirical molecular orbital method.

The geometries of the molecular structures are optimized using the hybrid functional B3LYP with the 6-31 G* basis set in the gas phase as implemented in the program package TURBOMOLE V6.5 (TURBOMOLE GmbH, Litzenhardtstrasse 19, 76135 Karlsruhe, Germany). If more than one conformation is viable, the conformation with the lowest total energy is selected to determine the bond lengths of the molecules.

The molecular weight is calculated based on the chemical formula of a single unit (also called monomer) of the first organic compound or metal borate compound and measured in gram per mol (g/mol). The term single unit particularly applies if the first organic compound or the metal borate compound is in the form of a dimer or a trimer. If no dimer or trimer (or oligo-/polymer) is formed, the molecular weight of the single unit is the same as that of the first organic compound or the metal borate compound. If the molecular weight is selected in this range, the compounds can be transferred into the gas phase at a temperature and rate which are suitable for mass production.

According to another embodiment, the first organic compound has
i) a dipole moment in the range of ≥0 and ≤1.8 Debye, alternatively ≥0 and ≤1.6 Debye, alternatively ≥0 and ≤1.4 Debye, alternatively ≥0.1 and ≤1.2 Debye; and/or
ii) a molecular weight in the range of ≥410 and ≤1,600, alternatively ≥410 and ≤1,400, alternatively ≥420 and ≤1,400, alternatively ≥420 and ≤1,200, alternatively ≥420 and ≤1,000, alternatively ≥420 and ≤800, alternatively ≥420 and ≤700.

In accordance with the present invention, it may be provided that the first composition comprises one or two or more first organic compound(s). Likewise, it may be provided that the first composition comprises one metal borate compound or two or more metal borate compounds.

With respect to the inventive method, step b) thereof, it may be provided that transferring the first composition from the solid phase into the gas phase comprises a further step of transferring the first composition from the solid phase into an at least partially melted state prior to transfer into the gas phase. In other words, it may be provided that the first composition is (at least partially) not sublimated (direct transition from the solid phase into the gas phase) but is (at least partially) transferred into the gas phase from the liquid phase.

According to another aspect of the present invention, the first composition, i.e. the mixture comprising the first organic compound and the metal borate compound (or two or more of the respective compounds), may be transferred into the gas phase from a single vacuum thermal evaporation source which is the first vacuum thermal evaporation source.

The term "single vacuum thermal evaporation source" as used herein shall not be construed in a way that only one single vacuum thermal evaporation source may be arranged within the vacuum chamber. Rather, it might be provided that more than one single vacuum thermal evaporation sources are used in parallel, at least one of which comprises the first composition. The term "single" in this regard should rather be understood in that, according to the inventive concept, the first composition is evaporated from only one (single) evaporation source.

According to the inventive method, it is provided that the first composition is deposited in step c) on the surface of a foregoing layer to form the organic semiconducting layer. The foregoing layer in this regard may, in principle, be any layer commonly comprised in organic electronic devices and referred to herein in the section "Further layers".

With respect to the inventive method, it may be provided that the first composition consists of the first organic compound (or two or more of the respective compounds) and the metal borate compound (or two or more of the respective metal borate compounds), i.e. that the composition comprises, besides the one or more first organic compound(s) and the one or more metal borate compound(s), further compounds only in such amounts which cannot be avoided by common technical means.

The first composition may be prepared by mixing the first organic compound and the metal borate compound in the solid phase, through co-evaporation and subsequent condensation, through melting and subsequent cooling, or through dissolving in a solvent and subsequent removal of the solvent.

It may be provided that the first organic compound comprises at least one group selected from $C_{10}$ to $C_{24}$ condensed aryl group, alternatively a $C_{10}$ to $C_{18}$ condensed aryl group, alternatively naphthyl, anthracenyl, fluoroanthrenyl, phenanthrenyl, pyrenyl, fluorenyl; and/or a $C_3$ to $C_{24}$ heteroaryl group, alternatively $C_3$ to $C_{21}$ heteroaryl group, alternatively triazinyl, pyrazinyl, acridinyl, benzoacridinyl, dibenzoacridinyl, xanthenyl, pyrimidinyl, quinolinyl, benzoquinolinyl, quinoxalinyl, benzoquinoxaline, benzofuranyl, benzthiophenyl, dibenzofuranyl, dibenzothiophenyl.

The heteroaryl group may comprise one to three heteroatoms independently selected from N, O or S, alternatively one to three N atoms or one O or S atom. Likewise, it may be provided that the first organic compound comprises at least one group selected from a $C_{10}$ to $C_{24}$ condensed aryl group, alternatively a $C_{10}$ to $C_{18}$ condensed aryl group, alternatively anthracenyl, fluoranthenyl, phenanthrenyl; and/or a $C_3$ to $C_{24}$ heteroaryl group, alternatively a $C_3$ to $C_{21}$ heteroaryl group comprising one O or S atom, alternatively benzofuranyl, benzothiophenyl, dibenzofuranyl, dibenzothiophenyl.

It may be provided that the first organic compound comprises at least one group selected from a $C_{10}$ to $C_{24}$ condensed aryl group, alternatively a $C_0$ to $C_{18}$ condensed aryl group, alternatively fluorenyl, naphthyl, anthracenyl, fluoranthenyl, phenanthrenyl, pyrenyl and is free of hetero atoms.

The first organic compound may further comprise a group selected from substituted or unsubstituted substituted or unsubstituted spiro[fluorene-9,9'-xanthene]-yl, substituted or unsubstituted 9,9'-dimethylfluorenyl, substituted or unsubstituted 9,9'-diphenylfluorenyl, 9,9'-spiro[bifluorene]-yl, substituted or unsubstituted naphthyl, substituted or unsubstituted phenanthrenyl, substituted or unsubstituted fluoranthenyl, a substituted or unsubstituted group consisting of 3 to 6 connected phenyl rings, or substituted or unsubstituted tetraphenylethenyl.

The first organic compound may be represented by formula 1a $$(1a)$$

wherein
$A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;
$A^5$ is selected from unsubstituted or substituted $C_{10}$-$C_{30}$ condensed aryl or from unsubstituted or substituted $C_3$-$C_{30}$ heteroaryl;
$R^1$ to $R^5$ are independently selected from substituted or unsubstituted phenyl;
a) to e) are independently selected as 0 or 1 with the provision that $2 \leq a+b+c+d+e \leq 5$;
wherein in the Formula 1a, the one or more substituent(s), if present, are independently selected from
(i) deuterium,
(ii) halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_0$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_6$ to $C_{30}$ aryl group,
(x) a $C_2$ to $C_{30}$ heteroaryl group,
(xi) a $C_1$ to $C_{30}$ perfluoro-hydrocarbyl group, or
(xii) a $C_1$ to $C_{10}$ trifluoroalkyl group;
and/or
the first organic compound may be represented by Formula 1b $$(1b)$$

wherein
$A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;
$A^5$ is selected from unsubstituted or substituted $C_{10}$ to $C_{30}$ condensed aryl or from unsubstituted or substituted $C_3$ to $C_{30}$ heteroaryl;
$R^1$ to $R^3$ are independently selected from substituted or unsubstituted phenyl;
wherein in Formula 1b, the one or more substituent(s), if present, are independently selected from the group consisting of
(i) deuterium,
(ii) halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_6$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_0$ to $C_{30}$ aryl group,
(x) a $C_2$ to $C_{30}$ heteroaryl group,
(xi) a $C_1$ to $C_{30}$ perfluoro-hydrocarbyl group,
(xii) a $C_1$ to $C_{10}$ trifluoroalkyl group;
and/or
the first organic compound may be represented by Formula 1c $$(1c)$$

wherein
the compound of formula (1c) comprises one moiety-$A^1$-$A^2$-$A^3$-$A^4$-$A^5$, wherein the asterisk symbol "*" marks the possible binding positions of the moiety-$A^1$-$A^2$-$A^3$-$A^4$-$A^5$ to the remaining structure;

$A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;

$A^5$ is selected from unsubstituted or substituted $C_{10}$ to $C_{30}$ condensed aryl or from unsubstituted or substituted $C_3$ to $C_{30}$ heteroaryl;

wherein in Formula 1c, the one or more substituent(s), if present, are independently selected from the group consisting of
(i) deuterium,
(ii) halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_0$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_6$ to $C_{30}$ aryl group,
(x) a $C_2$ to $C_{30}$ heteroaryl group,
(xi) a $C_1$ to $C_{30}$ perfluoro-hydrocarbyl group,
(xii) a $C_1$ to $C_{10}$ trifluoroalkyl group;
and/or
the first organic compound may be represented by Formula 1d

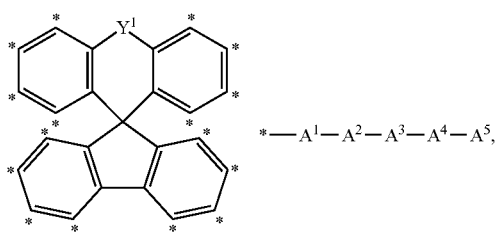

(1d)

$*-A^1-A^2-A^3-A^4-A^5$, wherein
the compound of formula (1d) comprises one moiety-$A^1$-$A^2$-$A^3$-$A^4$-$A^5$, wherein the asterisk symbol "*" marks the possible binding positions of the moiety-$A^1$-$A^2$-$A^3$-$A^4$-$A^5$ to the remaining structure;

$Y^1$ is selected from a single bond, O, S, $CR_2$ or $SiR_2$, wherein R is independently selected from $C_1$ to $C_{12}$ alkyl or $C_6$ to $C_{18}$ aryl;

$A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;

$A^5$ is selected from unsubstituted or substituted $C_{10}$ to $C_{30}$ condensed aryl or from unsubstituted or substituted $C_3$ to $C_{30}$ heteroaryl;

wherein in Formula 1d, the one or more substituent(s), if present, are independently selected from the group consisting of
(i) deuterium,
(ii) halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_0$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_6$ to $C_{30}$ aryl group,
(x) a $C_2$ to $C_{30}$ heteroaryl group,
(xi) a $C_1$ to $C_{30}$ perfluoro-hydrocarbyl group,
(xii) a $C_1$ to $C_{10}$ trifluoroalkyl group.

In another embodiment, $A^1$, $A^2$, $A^3$ and $A^4$ are independently selected from a single bond, a substituted or unsubstituted $C_6$ to $C_{12}$ arylene or unsubstituted or substituted $C_3$ to Clo heteroarylene; alternatively, $A^1$, $A^2$, $A^3$ and $A^4$ are independently selected from a single bond, a substituted or unsubstituted phenylene.

In another embodiment, the one or more substituents in formula (1a) to (1d), if present, are independently selected from $C_6$ to $C_{12}$ aryl and/or Cs to $C_{12}$ heteroaryl.

According to another embodiment, in the above compounds of Formula (1a) to (1d)
a) $A^1$ to $A^3$ may be selected from a single bond, $A^4$ may be a phenyl group and $A^5$ may be selected from a substituted or unsubstituted $C_{10}$ to $C_{30}$ condensed aryl group and/or at least one unsubstituted or substituted $C_3$ to $C_{30}$ heteroaryl group;
b) $A^1$ and $A^2$ may be selected from a single bond, $A^3$ and $A^4$ may be a phenyl group and $A^5$ may be selected from a substituted or unsubstituted $C_{10}$ to $C_{30}$ condensed aryl group and/or at least one unsubstituted or substituted $C_3$ to $C_{30}$ heteroaryl group; or
c) $A^1$ may be selected from a single bond, $A^2$ to $A^4$ may be a phenyl group and $A^5$ may be selected from a substituted or unsubstituted $C_{10}$ to $C_{30}$ condensed aryl group and/or at least one unsubstituted or substituted $C_3$ to $C_{30}$ heteroaryl group;
wherein the one or more substituent(s) if present, are independently selected from the group consisting of $C_6$ to $C_{12}$ aryl and/or $C_8$ to $C_{12}$ heteroaryl.

According to another embodiment, in the above compounds of Formula (1a) to (1d)
a) $A^1$ to $A^3$ may be selected from a single bond, $A^4$ may be a phenyl group and $A^5$ may be selected from a substituted or unsubstituted $C_{10}$ to $C_{30}$ condensed aryl group;
b) $A^1$ and $A^2$ may be selected from a single bond, $A^3$ and $A^4$ may be a phenyl group and $A^5$ may be selected from a substituted or unsubstituted $C_{10}$ to $C_{30}$ condensed aryl group; or
c) $A^1$ may be selected from a single bond, $A^2$ to $A^4$ may be a phenyl group and $A^5$ may be selected from a substituted or unsubstituted $C_{10}$ to $C_{30}$ condensed aryl group;
wherein the one or more substituent(s) if present, are independently selected from the group consisting of $C_6$ to $C_{12}$ aryl and/or $C_8$ to $C_{12}$ heteroaryl.

According to another embodiment, in the above compounds of Formula (1a) to (1d)
a) $A^1$ to $A^3$ may be selected from a single bond, $A^4$ may be a phenyl group and $A^5$ may be selected from at least one unsubstituted or substituted $C_3$ to $C_{30}$ heteroaryl group;
b) $A^1$ and $A^2$ may be selected from a single bond, $A^3$ and $A^4$ may be a phenyl group and $A^5$ may be selected from at least one unsubstituted or substituted $C_3$ to $C_{30}$ heteroaryl group; or
c) $A^1$ may be selected from a single bond, $A^2$ to $A^4$ may be a phenyl group and $A^5$ may be selected from at least one unsubstituted or substituted $C_3$ to $C_{30}$ heteroaryl group;

wherein the one or more substituent(s) if present, are independently selected from the group consisting of $C_6$ to $C_{12}$ aryl and/or Cs to $C_{12}$ heteroaryl.

In another embodiment, the first organic compound may comprise a substituted triazine, wherein the substituents are independently selected from $C_6$ to $C_{12}$ aryl and/or $C_8$ to $C_{12}$ heteroaryl. Preferably, the $C_8$ to $C_{12}$ heteroaryl group comprises a heteroatom selected from S or O.

In this way, homogeneity and/or conductivity of the organic semiconducting layer prepared by the inventive method is further improved.

The metal borate compound may be an alkali borate compound, an alkaline earth borate compound or a rare earth metal borate compound having a molecular weight in the range of >100 to <1,200, alternatively >150 to <1,000, alternatively >200 to <800, alternatively >250 to <600.

The metal borate compound may comprise a metal selected from alkali, alkaline earth or rare earth metal; alternatively the metal may be selected from alkali or alkaline earth metal; alternatively the metal may be selected from lithium, calcium or magnesium.

In this way, homogeneity and/or conductivity of the organic semiconducting layer prepared by the inventive method is further improved.

The metal borate compound may have the following formula 2

(2)

wherein M is a metal ion, each of $A^6$ to $A^9$ is independently selected from H, substituted or unsubstituted $C_6$ to $C_{20}$ aryl and substituted or unsubstituted $C_2$ to $C_{20}$ heteroaryl and n is valency of the metal ion. In this way, conductivity of the organic semiconducting layer prepared by the inventive method is further improved.

In the formula (2), n may be 1 or 2. In this way, conductivity of the organic semiconducting layer prepared by the inventive method is further improved.

M in formula 2 may be an alkali metal, an alkaline earth metal or a rare earth metal, alternatively an alkali metal or alkaline earth metal, alternatively selected from lithium, magnesium or calcium. In this way, conductivity of the organic semiconducting layer prepared by the inventive method is further improved.

At least three groups selected from $A^6$ to $A^9$ in formula (2) may be nitrogen-containing heteroaryl. In this way, conductivity of the organic semiconducting layer prepared by the inventive method is further improved.

The heteroaryl of formula (2) may contain a nitrogen and the nitrogen containing heteroaryl is bound to the central boron atom via a N—N bond. In this way, conductivity of the organic semiconducting layer prepared by the inventive method is further improved.

The heteroaryl in formula (2) may be pyrazolyl. In this way, conductivity of the organic semiconducting layer prepared by the inventive method is further improved.

The metal borate compound of formula (2) may be represented by the following Formula (2a) or (2b)

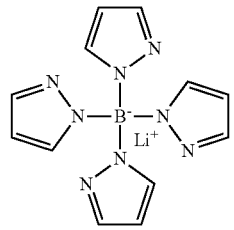

(2a)

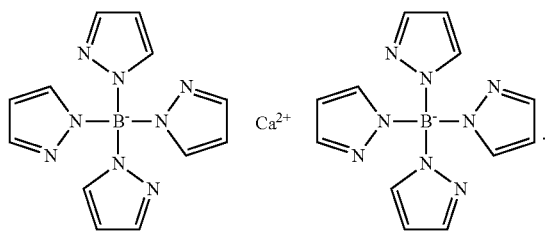

(2b)

In this way, conductivity of the organic semiconducting layer prepared by the inventive method is further improved.

According to another embodiment, ratio of first organic compound to metal borate compound may be selected between 90:10 to 10:90 wt.-%, alternatively 80:20 to 20:80 wt.-%, alternatively 70:30 to 30:70 wt.-%.

In a preferred embodiment, the first organic compound and/or the metal borate compound is non-emissive. Alternatively, the first composition is non-emissive.

The method may further comprise the steps of
e) providing a second organic compound in a second vacuum thermal evaporation source;
f) transferring the second organic compound from the solid phase into the gas phase in the vacuum chamber; and
g) depositing the first composition together with the second organic compound to form the organic semiconducting layer.

In this way, the charge injection and transport properties of the semiconducting layer, in particular in connection with the cathode, may be improved.

The second organic compound may have a dipole moment in the range of >1.5 Debye and <10 Debye; and a molecular weight in the range of >400 and <1,800. Alternatively, the second organic compound may have a dipole moment in the range of >2 Debye and <8 Debye, alternatively >3 Debye and <6 Debye, alternatively >3.5 Debye and <6 Debye; and a molecular weight in the range of >400 and <1,600; alternatively >410 and <1,400; alternatively >410 and <1,200; alternatively >410 and <1,000; alternatively >410 and <800.

In this way, homogeneity and charge injection and transport properties of the semiconducting layer, in particular in connection with the cathode, may be improved.

The second organic compound may comprise at least one group selected from phenanthroline, benzimidazole, pyridine-4-yl, pyrimidine, quinoline, benzoquinoline, dibenzoquinoline, quinoxaline, benzoquinoxaline, dibenzoquinaxoline, xanthene, C=O; COOR, wherein R is selected from $C_1$ to $C_{12}$ alkyl or $C_6$ to $C_{18}$ aryl; P=X, wherein X is selected from O, S or Se, alternatively from O or S, alternatively X is O.

According to another embodiment, the second organic compound may further comprise at least one unsubstituted or substituted $C_{10}$ to $C_{30}$ condensed aryl group and/or at least one unsubstituted or substituted $C_3$ to $C_{30}$ heteroaryl group, wherein the one or more substituent(s) if present, are independently selected from the group consisting of (i) deuterium, (ii) a halogen, (iii) a $C_1$ to $C_{22}$ silyl group, (iv) a $C_1$ to $C_{30}$ alkyl group, (v) a $C_1$ to $C_{10}$ alkylsilyl group, (vi) a $C_0$ to $C_{22}$ arylsilyl group, (vii) a $C_3$ to $C_{30}$ cycloalkyl group, (viii) a $C_2$ to $C_{30}$ heterocycloalkyl group, (ix) a $C_6$ to $C_{30}$ aryl group, (x) a $C_2$ to $C_{30}$ heteroaryl group, (xi) a $C_1$ to $C_{30}$ perfluoro-hydrocarbyl group, and (xii) a $C_1$ to $C_{10}$ trifluoroalkyl group.

According to another embodiment, the second organic compound may comprise a phosphine oxide group and at least one unsubstituted or substituted $C_{10}$ to $C_{30}$ condensed aryl group and/or at least one unsubstituted or substituted $C_3$ to $C_{30}$ heteroaryl group, wherein the one or more substituent(s) if present, are independently selected from the group consisting of a $C_1$ to $C_{30}$ alkyl group, a $C_6$ to $C_{30}$ aryl group, a $C_2$ to $C_{30}$ heteroaryl group.

In this way, the charge injection and transport properties of the semiconducting layer, in particular in connection with the cathode, may be improved.

Preferably, the organic semiconducting layer comprising the first composition and the optional second organic compound is essentially non-emissive or non-emitting.

The object is further achieved by an organic electronic device comprising an anode, a cathode and an organic semiconducting layer, wherein the organic semiconducting layer is obtainable by the method as described herein. In this regard, preferred embodiments with respect to the above method are also preferred embodiments with respect to the organic electronic device.

The organic electronic device may further comprise a photoactive layer arranged between the anode and the cathode. The photoactive layer may be a light-emitting or light-absorbing layer.

In a preferred embodiment, the organic semiconducting layer may be arranged between the photoactive layer and the cathode.

The organic electronic device may further comprise an electron injecting layer and/or a hole blocking layer.

The organic semiconducting layer may be arranged between the hole blocking layer and the cathode. Alternatively, the organic semiconducting layer may be arranged between the photoactive layer and the electron injecting layer. Alternatively, the organic semiconducting layer may be arranged between the hole blocking layer and electron injecting layer.

An organic light-emitting diode (OLED) according to the invention may include an anode, a hole transport layer (HTL), an emission layer (EML), an electron transport layer (ETL) comprising at least one first composition, and a cathode, which are sequentially stacked on a substrate. In this regard, the HTL, the EML, and the ETL are thin films formed from organic compounds.

According to various embodiments, the OLED may have the following layer structure, wherein the layers may have the following order:

an anode, a hole injection layer, a first hole transport layer, a second hole transport layer, an emission layer, an optional hole blocking layer, the organic semiconducting layer prepared in accordance with the inventive method as defined herein, an optional electron injection layer, and a cathode.

An organic electronic device according to one embodiment can be a light emitting device, thin film transistor, a battery, a display device or a photovoltaic cell, and preferably a light emitting device.

The object is further achieved by a method for preparing an organic electronic device comprising a step of preparing an organic semiconducting layer according to the method as defined herein. Preferred embodiments with respect to the method for preparing the organic semiconducting layer as described herein also apply for the method for preparing the organic electronic device.

According to another aspect of the present invention, there is provided a method of manufacturing an organic electronic device, the method using:
   a first VTE source to release the first composition as described herein, and
   optionally, a second VTE source to release the second organic compound;
according to various embodiments of the present invention, the method may further include further steps of (i) forming on the anode electrode an emission layer and (ii) forming between the anode electrode and the first electron transport layer at least one layer selected from the group consisting a hole injection layer, a hole transport layer and a hole blocking layer.

According to various embodiments of the present invention, the method may further include the steps for forming an organic light-emitting diode (OLED), wherein
   on a substrate, a first anode electrode is formed,
   on the first anode electrode, an emission layer is formed,
   on the emission layer, an electron transport layer stack is formed, optionally, a hole blocking layer is formed on the emission layer and an organic semiconducting layer is formed,
   and, finally, a cathode electrode is formed,
   optionally, a hole injection layer, a hole transport layer, and a hole blocking layer may beformed in that order between the first anode electrode and the emission layer,
   optionally, an electron injection layer is formed between the organic semiconducting layer and the cathode electrode.

According to various embodiments of the present invention, the method may further comprise forming an electron injection layer on the organic semiconducting layer. However, according to various embodiments of the OLED of the present invention, the OLED may not comprise an electron injection layer.

The object is further achieved by a composition consisting of
   a) a first organic compound, the first organic compound comprising at least one $C_{10}$ to $C_{30}$ condensed aryl group and/or at least one $C_3$ to $C_{30}$ heteroaryl group, wherein the first organic compound has
       (i) a dipole moment in the range of $\geq 0$ and $\leq 2$ Debye; and
       (ii) a molecular weight in the range of $\geq 400$ to $\leq 1,800$; and
   b) a metal borate compound.

Also in this regard, preferred embodiments described above with respect to the method for preparing an organic semiconducting layer using the first composition, i.e. the first organic compound and the metal borate compound, also apply for the inventive composition.

The metal in the metal borate compound of the composition may in particular be selected from alkali metal, alkaline earth metal or rare earth metal, alternatively the metal may be selected from an alkali or alkaline earth metal, alternatively, the metal may be selected from lithium, calcium or magnesium.

With respect to the inventive composition, it may in particular be provided that the metal broate has a molecular weight in the range of ≥100 to <1,200.

In accordance with the invention, i.e. in accordance with the method for preparing an organic semiconducting layer, with the inventive organic electronic device and with the composition described herein, the following compounds are particularly preferred as the first organic compound

1

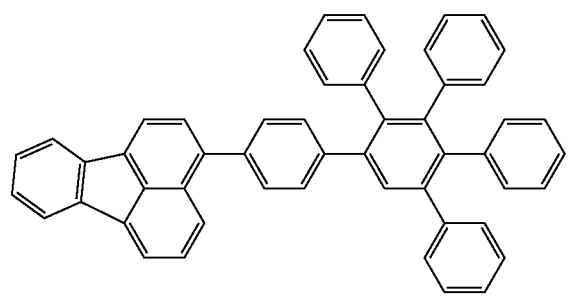 [SMILES: c1ccc(-c2cc(-c3ccc(-c4ccc5c6c(cccc46)-c4ccccc4-5)cc3)c(-c3ccccc3)c(-c3ccccc3)c2-c2ccccc2)cc1]

2

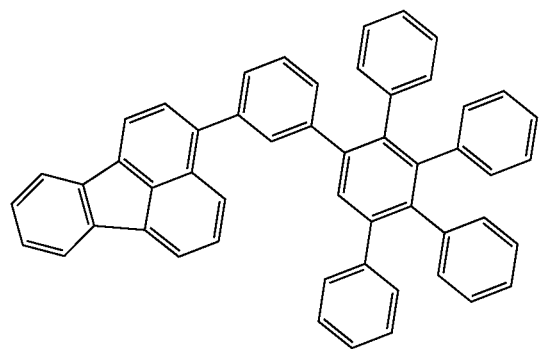

3

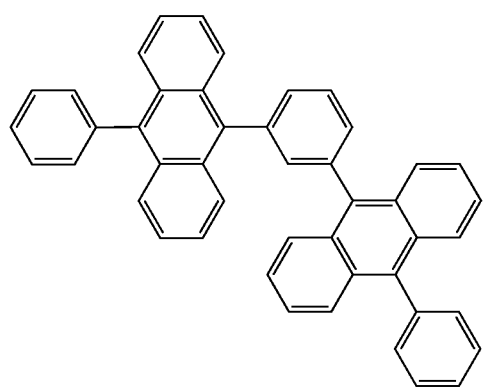 [SMILES: c1ccc(-c2c3ccccc3c(-c3cccc(-c4c5ccccc5c(-c5ccccc5)c5ccccc45)c3)c3ccccc23)cc1]

-continued

4

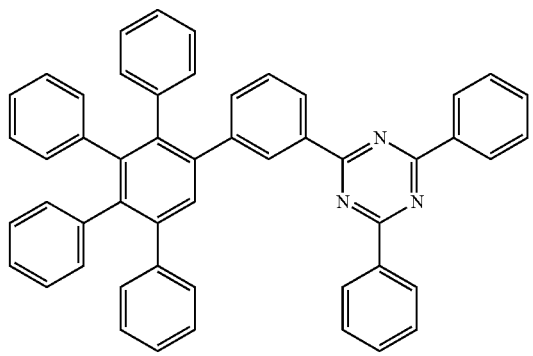 [SMILES: c1ccc(-c2nc(-c3ccccc3)nc(-c3cccc(-c4cc(-c5ccccc5)c(-c5ccccc5)c(-c5ccccc5)c4-c4ccccc4)c3)n2)cc1]

5

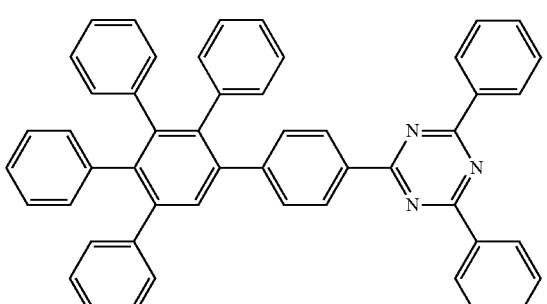

6

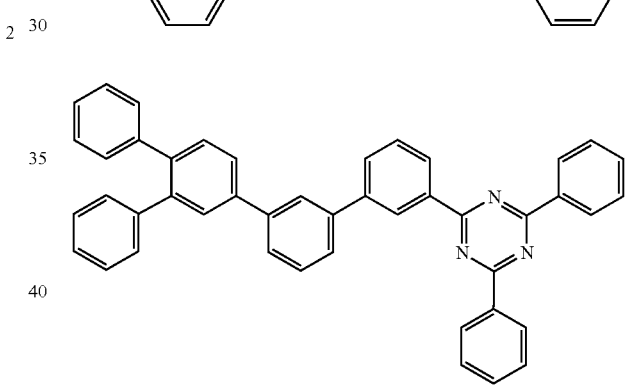

7

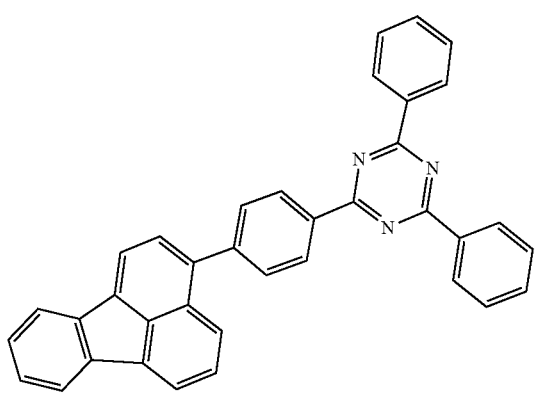

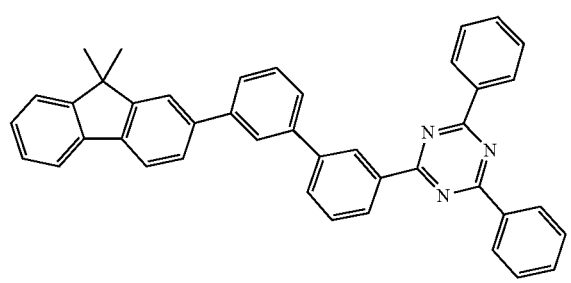
8
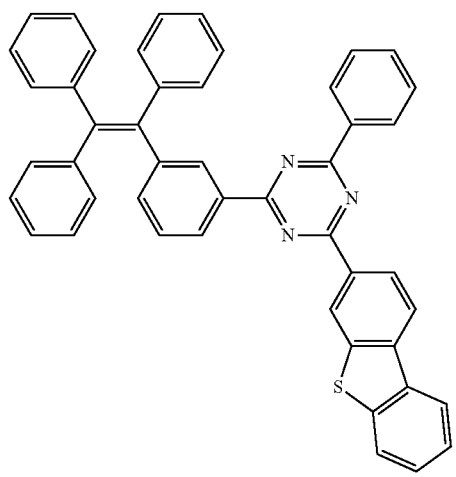
12
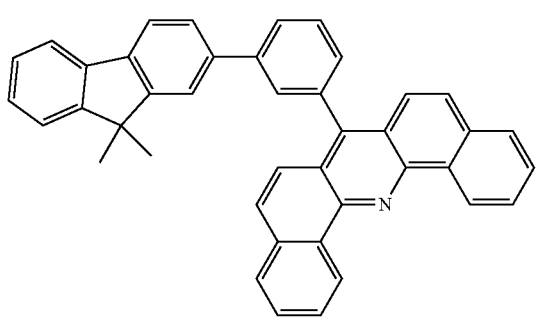
9
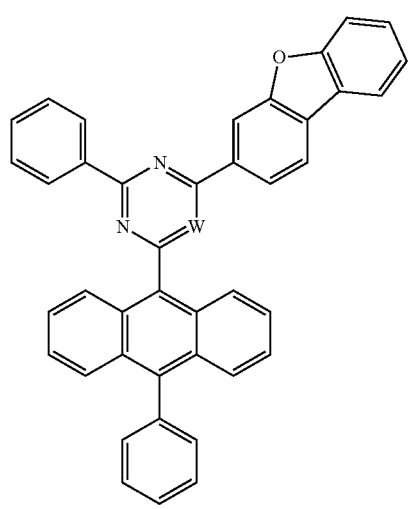
10
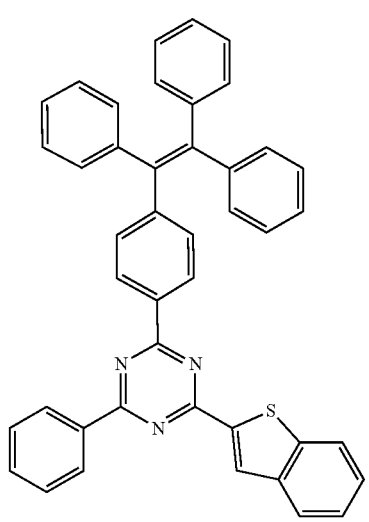
13
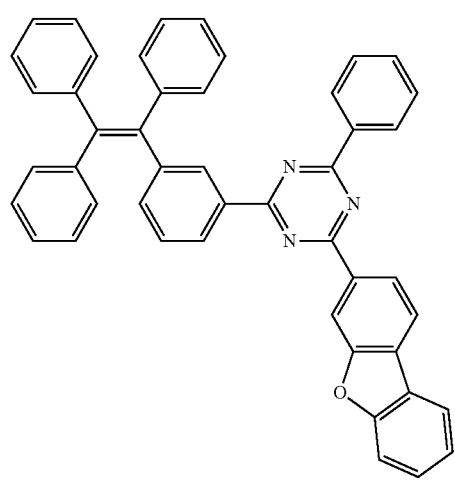
11
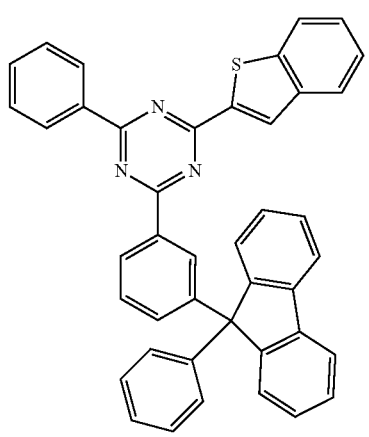
14

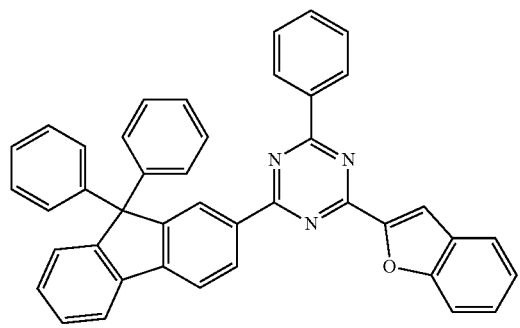

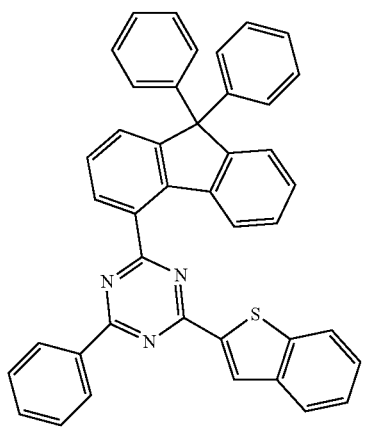

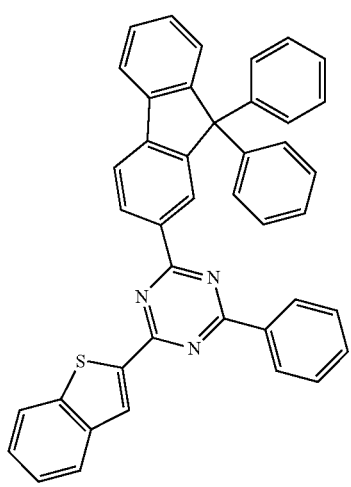

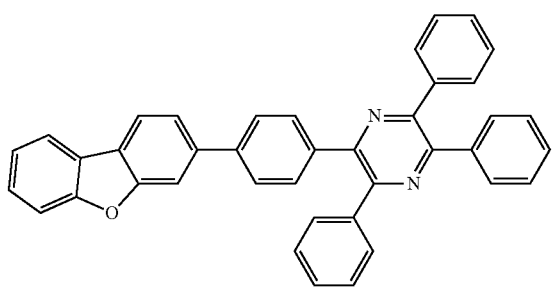

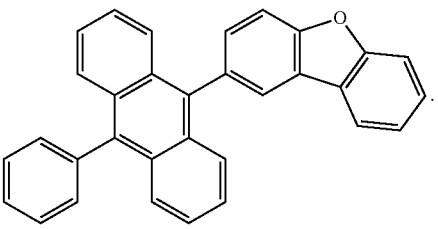

Further Layers

In accordance with the invention, the organic electronic device may comprise, besides the layers already mentioned above, further layers. Exemplary embodiments of respective layers are described in the following:

Substrate

The substrate may be any substrate that is commonly used in manufacturing of electronic devices. If light is to be transmitted through the substrate, the substrate shall be a transparent or semitransparent material, for example a glass substrate or a transparent plastic substrate. If light is to be transmitted through the top surface of the electronic device, the substrate may be both a transparent as well as a non-transparent material, for example a glass substrate, a plastic substrate, a metal substrate or a silicon substrate. The substrate may be rigid or flexible.

The organic semiconducting layer prepared by the method according to invention may be deposited on a substrate.

Alternatively, further layers may be arranged between the substrate and the organic semiconducting layer prepared by the method according to invention. These are described below.

Anode Electrode

Either a first electrode or a second electrode comprised in the inventive organic electronic device may be an anode electrode. The anode electrode may be formed by depositing or sputtering a material that is used to form the anode electrode. The material used to form the anode electrode may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide (SnO2), aluminum zinc oxide (AlZO) and zinc oxide (ZnO), may be used to form the anode electrode. The anode electrode may also be formed using metals, typically silver (Ag), gold (Au), or metal alloys.

Hole Injection Layer

A hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of 10-8 to 10-3 Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL may comprise or consist of p-type dopant and the p-type dopant may be selected from tetrafluoro-tetracyano-quinonedimethane (F4TCNQ), 2,2'-(perfluoronaphthalen-2,6-diylidene) dimalononitrile or 2,2',2"-(cyclopropane-1,2,3-triylidene)tris(2-(p-cyanotetrafluorophenyl)-acetonitrile) but not limited hereto. The HIL may be selected from a hole-transporting matrix compound doped with a p-type dopant. Typical examples of known doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N'-bis(phenyl)-benzidine) doped with F4TCNQ. α-NPD doped with 2,2'-(perfluoronaphthalen-2,6-diylidene) dimalononitrile. The p-type dopant concentrations can be selected from 1 to 20 wt.-%, more preferably from 3 wt.-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

A hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

The HTL may be formed of any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyl)triphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of an electron blocking layer (EBL) is to prevent electrons from being transferred from an emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

If the electron blocking layer has a high triplet level, it may also be described as triplet control layer.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

It may be provided that the emission layer does not comprise the first composition.

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-tris(carbazol-9-yl)triphenylamine (TCTA), 1,3,5-tris (N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzothiazolate)zinc (Zn(BTZ)2).

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2Ir(acac), but are not limited thereto. These compounds are phosphorescent emitters, however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, (F2ppy)2Ir(tmd) and Ir(dfppz)3 and ter-fluorene. 4.4'-bis(4-diphenyl amiostyryl)biphenyl (DPAVBi), 2,5,8,11-tetra-tertbutyl perylene (TBPe) are examples of fluorescent blue emitter dopants.

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function. The hole blocking layer may be the organic semiconducting layer prepared in accordance with the inventive method as defined herein.

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, and phenanthroline derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The organic electronic device according to the present invention may further comprise an electron transport layer (ETL). In accordance with one preferred embodiment of the invention, the electron transport layer may be the organic semiconducting layer prepared in accordance with the inventive method as defined herein.

According to various embodiments the organic electronic device may comprise an electron transport layer or an electron transport layer stack comprising at least a first electron transport layer and at least a second electron transport layer.

By suitably adjusting energy levels of particular layers of the ETL, the injection and transport of the electrons may be controlled, and the holes may be efficiently blocked. Thus, the OLED may have long lifetime.

The electron transport layer of the organic electronic device may be the organic semiconducting layer prepared in accordance with the inventive method as defined herein. The electron transport layer may comprise, besides or instead the first organic compound and the metal borate compound used for preparing the organic semiconducting layer, further electron transport materials known in the art. Likewise, the electron transport layer may consist of the first organic compound and the metal borate compound used for preparing the organic semiconducting layer. In case that the inventive organic electronic device comprises more than one electron transport layer, one or more than one of the electron transport layers may be the organic semiconducting layer prepared by the method described herein.

Electron Injection Layer (EIL)

An optional EIL, which may facilitates injection of electrons from the cathode, may be formed on the ETL, preferably directly on the electron transport layer. Examples of materials for forming the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL. The EIL may be the organic semiconducting layer prepared in accordance with the inventive method as defined herein.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Electrode

The cathode electrode is formed on the EIL if present. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, such as ITO or IZO.

The thickness of the cathode electrode may be in the range from about 5 nm to about 1000 nm, for example, in the range from about 10 nm to about 100 nm. When the thickness of the cathode electrode is in the range from about 5 nm to about 50 nm, the cathode electrode may be transparent or semitransparent even if formed from a metal or metal alloy.

It is to be understood that the cathode electrode is not part of an electron injection layer or the electron transport layer.

Charge Generation Layer/Hole Generating Layer

The charge generation layer (CGL) may comprise a p-type and an n-type layer. An interlayer may be arranged between the p-type layer and the n-type layer.

Typically, the charge generation layer is a pn junction joining an n-type charge generation layer (electron generating layer) and a hole generating layer. The n-side of the pn junction generates electrons and injects them into the layer which is adjacent in the direction to the anode. Analogously, the p-side of the p-n junction generates holes and injects them into the layer which is adjacent in the direction to the cathode.

Charge generating layers are used in tandem and stacked devices, for example, in tandem OLEDs comprising, between two electrodes, two or more emission layers. A stacked device may comprise two or more emission layers. In a tandem OLED comprising two emission layers, the n-type charge generation layer provides electrons for the first light emission layer arranged near the anode, while the hole generating layer provides holes to the second light emission layer arranged between the first emission layer and the cathode.

Suitable matrix materials for the hole generating layer may be materials conventionally used as hole injection and/or hole transport matrix materials. Also, p-type dopant used for the hole generating layer can employ conventional materials. For example, the p-type dopant can be one selected from a group consisting of tetrafluore-7,7,8,8-tetracyanoquinodimethane (F4-TCNQ), derivatives of tetracyanoquinodimethane, radialene derivatives, iodine, FeCl3, FeF3, and SbCl5. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB). The p-type charge generation layer may consist of CNHAT.

The n-type charge generating layer may be the layer prepared in accordance with the inventive method as defined herein. The n-type charge generation layer can be layer of a neat n-type dopant, for example of an electropositive metal, or can consist of an organic matrix material doped with the n-type dopant. In one embodiment, the n-type dopant can be alkali metal, alkali metal compound, alkaline earth metal, alkaline earth metal compound, a transition metal, a transition metal compound or a rare earth metal. In another embodiment, the metal can be one selected from a group consisting of Li, Na, K, Rb, Cs, Mg, Ca, Sr, Ba, La, Ce, Sm, Eu, Tb, Dy, and Yb. More specifically, the n-type dopant can be one selected from a group consisting of Cs, K, Rb, Mg, Na, Ca, Sr, Eu and Yb. Suitable matrix materials for the electron generating layer may be the materials conventionally used as matrix materials for electron injection or electron transport layers. The matrix material can be for example one selected from a group consisting of triazine compounds, hydroxyquinoline derivatives like tris(8-hydroxyquinoline) aluminum, benzazole derivatives, and silole derivatives.

The hole generating layer is arranged in direct contact to the n-type charge generation layer.

Hereinafter, the embodiments are illustrated in more detail with reference to examples. However, the present disclosure is not limited to the following examples. Reference will now be made in detail to the exemplary aspects.

DETAILS AND DEFINITIONS OF THE INVENTION

In the present specification, when a definition is not otherwise provided, an "alkyl group" may refer to an aliphatic hydrocarbon group. The alkyl group may refer to "a saturated alkyl group" without any double bond or triple bond. The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclohexyl.

The subscripted number n in Cn relates to the total number of carbon atoms in the respective alkyl, arylene, heteroarylene or aryl group.

The term "aryl, respectively arylene" as used herein shall encompass phenyl (respectively phenylene) and fused aromatics, such as naphthyl, anthracenyl, phenanthracenyl, tetracenyl (respectively naphthalenylene, anthracenylene, phenanthracenylene, tetracenylene etc.]. Not encompassed are aryl groups in which two or more of the above moieties are connected by single bonds, such as biphenyl(en) and oligo- or polyphenyl(en) such as tetraphenyl(en) etc. A heteroaryl(en) as referred to herein refers to an aryl group as defined above in which at least one carbon atom is substituted by a heteroatom, preferably selected from N, O, S, B or Si.

The term "condensed aryl(ene) group" refers to an aryl group comprising at least two aromatic rings which are fused to each other by sharing two carbon atoms with each other. In this regard, it may be provided that the condensed aryl group (or the condensed arylene group) comprises more than two fused rings wherein each of the rings is fused with at least one other aryl ring of the condensed aryl(ene) by sharing with this one (or more) further ring(s) two carbon atoms. Non-limiting examples of such condensed aryl groups are naphthyl, anthracenyl, fluorenyl, phenanthrenyl, fluoranthenyl etc.

The term "alkenyl" as used herein refers to a group —$CR^1$=$CR^2R^3$ comprising a carbon-carbon double bond.

The term "perhalogenated" as used herein refers to a hydrocarbyl group wherein all of the hydrogen atoms of the hydrocarbyl group are replaced by halogen (F, Cl, Br, I) atoms.

The term "alkoxy" as used herein refers to a structural fragment of the Formula —OR with R being hydrocarbyl, preferably alkyl or cycloalkyl.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

In the present specification, the single bond refers to a single bond.

The term "fluorinated" as used herein refers to a hydrocarbon group in which at least one of the hydrogen atoms comprised in the hydrocarbon group is substituted by a fluorine atom. Fluorinated groups in which all of the hydrogen atoms thereof are substituted by fluorine atoms are referred to as perfluorinated groups and are particularly addressed by the term "fluorinated".

In terms of the invention, a group is "substituted with" another group if one of the hydrogen atoms comprised in this group is replaced by another group, wherein the other group is the substituent.

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

With respect to the inventive organic semiconductive layer as well as with respect to the inventive compound, the compounds mentioned in the experimental part are most preferred.

The inventive organic electronic device may be an organic electroluminescent device (OLED) an organic photovoltaic device (OPV), a lighting device, or an organic field-effect transistor (OFET). A lighting device may be any of the devices used for illumination, irradiation, signaling, or projection. They are correspondingly classified as illuminating, irradiating, signaling, and projecting devices. A lighting device usually consists of a source of optical radiation, a device that transmits the radiant flux into space in the desired direction, and a housing that joins the parts into a single device and protects the radiation source and light-transmitting system against damage and the effects of the surroundings.

The terms "OLED" and "organic light-emitting diode" are simultaneously used and have the same meaning. The term "organic electroluminescent device" as used herein may comprise both organic light emitting diodes as well as organic light emitting transistors (OLETs).

The organic electroluminescent device (OLED) may be a bottom- or top-emission device.

A device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural Formula.

The terms "emission layer" and "light-emitting layer" are simultaneously used and have the same meaning.

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is under-stood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

In the context of the present specification the term "essentially non-emissive" or "non-emissive" means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≤780 nm.

The operating voltage, also named U, is measured in Volt (V) at 10 milliAmpere per square centimeter (mA/cm2).

The candela per Ampere efficiency, also named cd/A efficiency is measured in candela per ampere at 10 milli-Ampere per square centimeter (mA/cm2).

The external quantum efficiency, also named EQE, is measured in percent (%).

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED", "organic light emitting diode", "organic light emitting device", "organic optoelectronic device" and "organic light-emitting diode" are simultaneously used and have the same meaning.

The term "life-span" and "lifetime" are simultaneously used and have the same meaning.

The anode electrode and cathode electrode may be described as anode electrode/cathode electrode or anode electrode/cathode electrode or anode electrode layer/cathode electrode layer.

Room temperature, also named ambient temperature, is 23° C.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
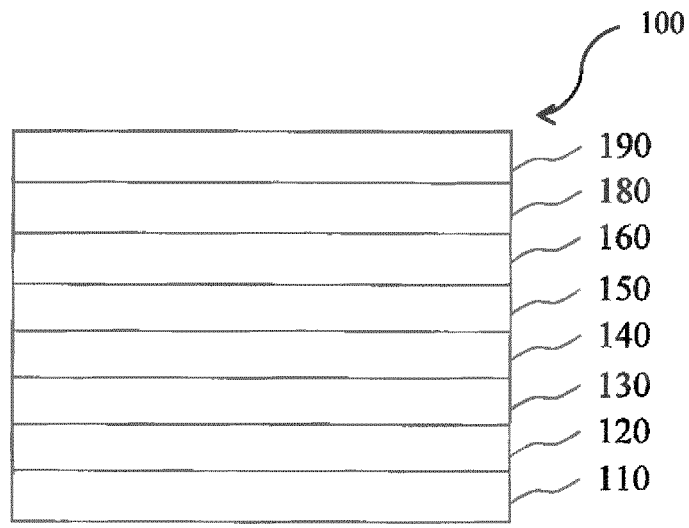
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

FIG. 1 is a schematic sectional view of an organic light-emitting diode (OLED) 100, according to an exemplary embodiment of the present invention. The OLED 100 includes a substrate 110, an anode 120, a hole injection layer (HIL) 130, a hole transport layer (HTL) 140, an emission layer (EML) 150, an electron transport layer (ETL) 160. The electron transport layer (ETL) 160 is formed on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 2:
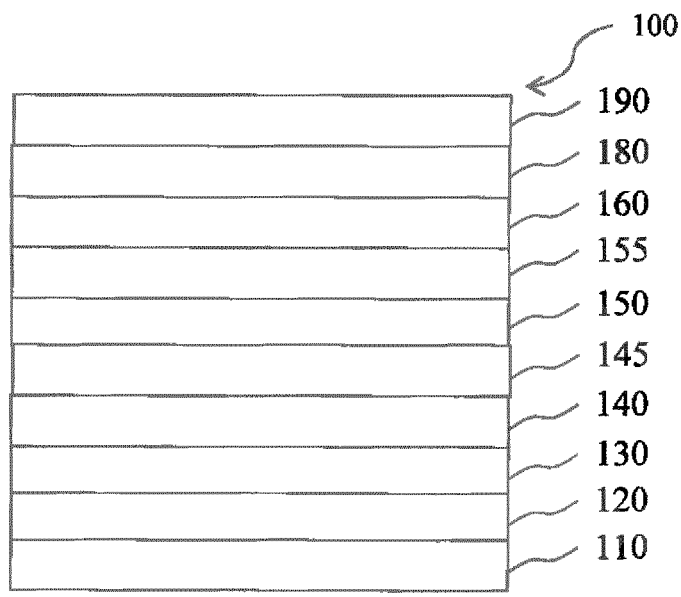
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 2, the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Preferably, the organic semiconducting layer comprising a first composition may be an ETL.

Figure 3:
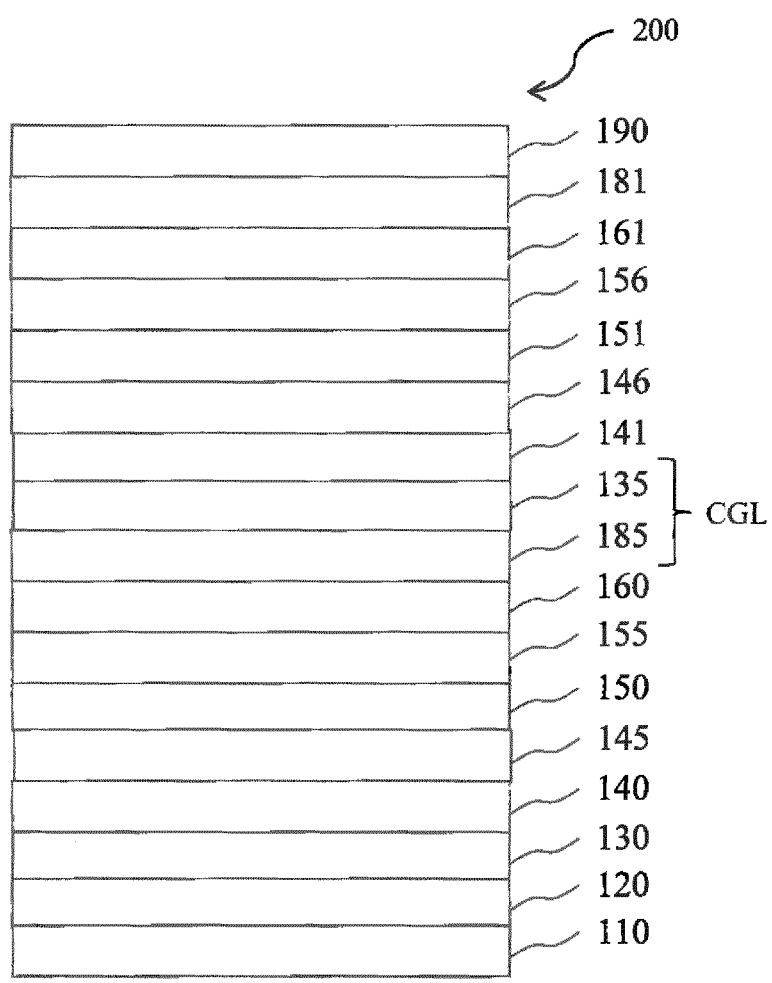
FIG. 3 is a schematic sectional view of a tandem OLED comprising a charge generation layer, according to an exemplary embodiment of the present invention.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer (CGL) and a second emission layer (151).

Referring to FIG. 3, the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

Preferably, the organic semiconducting layer comprising a first composition may be the first ETL and/or second ETL.

While not shown in FIG. 1, FIG. 2 and FIG. 3, a sealing layer may further be formed on the cathode electrodes 190, in order to seal the OLEDs 100 and 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

Melting Point

The melting point (mp) is determined as peak temperatures from the DSC curves of the above TGA-DSC measurement or from separate DSC measurements (Mettler Toledo DSC822e, heating of samples from room temperature to completeness of melting with heating rate 10 K/min under a stream of pure nitrogen. Sample amounts of 4 to 6 mg are placed in a 40 µL Mettler Toledo aluminum pan with lid, a <1 mm hole is pierced into the lid).

Glass Transition Temperature

The glass transition temperature (Tg) is measured under nitrogen and using a heating rate of 10 K per min in a Mettler Toledo DSC 822e differential scanning calorimeter as described in DIN EN ISO 11357, published in March 2010.

Rate Onset Temperature

The rate onset temperature ($T_{RO}$) is determined by loading 100 mg compound into a VTE source. As VTE source a point source for organic materials may be used as supplied by Kurt J. Lesker Company (www.lesker.com) or CreaPhys GmbH (http://www.creaphys.com). The VTE source is heated at a constant rate of 15 K/min at a pressure of less than 10-5 mbar and the temperature inside the source measured with a thermocouple. Evaporation of the compound is detected with a QCM detector which detects deposition of the compound on the quartz crystal of the detector. The deposition rate on the quartz crystal is measured in Angstrom per second. To determine the rate onset temperature, the deposition rate is plotted against the VTE source temperature. The rate onset is the temperature at which noticeable deposition on the QCM detector occurs. For accurate results, the VTE source is heated and cooled three time and only results from the second and third run are used to determine the rate onset temperature.

To achieve good control over the evaporation rate of an organic compound, the rate onset temperature may be in the range of 200 to 255° C. If the rate onset temperature is below 200° C. the evaporation may be too rapid and therefore difficult to control. If the rate onset temperature is above 255° C. the evaporation rate may be too low which may result in low tact time and decomposition of the organic compound in VTE source may occur due to prolonged exposure to elevated temperatures.

The rate onset temperature is an indirect measure of the volatility of a compound. The higher the rate onset temperature the lower is the volatility of a compound.

According to another embodiment, the difference between rate onset temperature of the first organic compound and the metal borate compound is less than 60 K, alternatively less than 50 K, alternatively less than 40 K.

Thereby, homogeneity of the organic semiconducting layer prepared by the method according to invention may be improved.

Reduction Potential

The reduction potential is determined by cyclic voltammetry with potenioststic device Metrohm PGSTAT30 and software Metrohm Autolab GPES at room temperature. The redox potentials given at particular compounds were measured in an argon de-aerated, dry 0.1M THF solution of the tested substance, under argon atmosphere, with 0.1M tetra-butylammonium hexafluorophosphate supporting electrolyte, between platinum working electrodes and with an Ag/AgCl pseudo-standard electrode (Metrohm Silver rod electrode), consisting of a silver wire covered by silver chloride and immersed directly in the measured solution, with the scan rate 100 mV/s. The first run was done in the broadest range of the potential set on the working electrodes, and the range was then adjusted within subsequent runs appropriately. The final three runs were done with the addition of ferrocene (in 0.1M concentration) as the standard. The average of potentials corresponding to cathodic and anodic peak of the studied compound, after subtraction of the average of cathodic and anodic potentials observed for the standard $Fc^+/Fc$ redox couple, afforded finally the values reported above. All studied compounds as well as the reported comparative compounds showed well-defined reversible electrochemical behaviour.

Calculated HOMO and LUMO

The HOMO and LUMO are calculated with the program package TURBOMOLE V6.5. The optimized geometries and the HOMO and LUMO energy levels of the molecular structures are determined by applying the hybrid functional B3LYP with a 6-31G* basis set in the gas phase. If more than one conformation is viable, the conformation with the lowest total energy is selected.

Preparation of the First Composition

The first organic compound and the metal borate compound may be prepared by methods known in the art.

In Table 1, properties are shown of first organic compounds which can be suitable used.

The first composition may be prepared by mixing the first organic compound and the metal borate compound as in the solid state, followed by evaporation and condensation at a pressure of 10-3 to 10-7 mbar.

In Table 2, first compositions are shown which can be suitable used. Metal borate compound of Formula (2a) may be referred to as Li-1 and metal borate compound of Formula (2b) may be referred to as Li-2.

Preparation of the Second Organic Compound

The second organic compounds may be prepared by methods known in the art. In Table 3 are shown examples of second organic compounds.

Electron-Only Devices (EOD)

To indirectly determine the conductivity of an organic semiconducting layer prepared by the method according to invention, electron-only devices were prepared and the operating voltage determined. The lower the operating voltage is at a given current density, the higher the conductivity of the organic semiconducting layers.

To prepare the electron-only devices, Example 1 and comparative example 1 in Table 4, a glass substrate was cut to a size of 50 mm×50 mm×0.7 mm, ultrasonically cleaned with isopropyl alcohol for 5 minutes and then with pure water for 5 minutes, and cleaned again with UV ozone for 30 minutes.

Then, 11 nm Mg:Ag alloy (90:10 vol.-%) were deposited on the glass substrate at a pressure of $10^{-5}$ to $10^{-7}$ mbar to form a first electrode.

Then, dimethyl(3-(10-(naphthalen-2-yl)anthracen-9-yl)phenyl)phosphine oxide (also referred to as ETM-1) as second organic compound and first composition C-1, see Example 1 in Table 4, or Li-1, see comparative example 1, were co-deposited on the first electrode to form a first organic semiconducting layer having a thickness of 17 nm. The concentration of the compounds in the layer can be taken from Table 4.

Then, a second organic semiconducting layer comprising the first composition, see example 1 in Table 4, or Li-1, see comparative example 1, was deposited on the first organic semiconducting layer to form a second organic semiconducting layer. The thickness of the second organic semiconducting layer can be taken from Table 4.

Then, dimethyl(3-(10-(naphthalen-2-yl)anthracen-9-yl)phenyl)phosphine oxide (also referred to as ETM-1) as second organic compound and first composition C-1, see Example 1 in Table 4, or Lithium tetra(1H-pyrazol-1-yl)borate (also referred to as Li-1), see comparative example 1, were co-deposited on the second organic semiconducting layer to form a third organic semiconducting layer having a thickness of 17 nm. The concentration of the compounds in the layer can be taken from Table 4.

Then, 11 nm Mg:Ag alloy (90:10 vol.-%) were deposited on the third organic semiconducting layer at a pressure of 10-5 to 10-7 mbar to form a second electrode.

The operating voltage was determined as described for OLEDs below.

General Procedure for Fabrication of OLEDs

For top emission devices, Example 2 to 6 in Table 5, a glass substrate was cut to a size of 50 mm×50 mm×0.7 mm, ultrasonically cleaned with isopropyl alcohol for 5 minutes and then with pure water for 5 minutes, and cleaned again with UV ozone for 30 minutes. 100 nm Ag were deposited on the glass substrate at a pressure of $10^{-5}$ to $10^{-7}$ mbar to form the anode.

Then, 92 vol.-% Biphenyl-4-yl(9,9-diphenyl-9H-fluoren-2-yl)-[4-(9-phenyl-9H-carbazol-3-yl)phenyl]-amine (CAS 1242056-42-3) with 8 vol.-% 2,2',2''-(cyclopropane-1,2,3-triylidene)tris(2-(p-cyanotetrafluorophenyl) acetonitrile) was vacuum deposited on the anode, to form a HIL having a thickness of 10 nm. Then, Biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 118 nm.

Then, for examples 2 and 3, N,N-bis(4-(dibenzo[b,d]furan-4-yl)phenyl)-[1,1': 4',1''-terphenyl]-4-amine (CAS 1198399-61-9) was vacuum deposited on the HTL, to form an electron blocking layer (EBL) having a thickness of 5 nm. For examples 4 to 6, N-(4-(dibenzo[b,d] furan-4-yl)phenyl)-N-(4-(9-phenyl-9H-fluoren-9-yl)phenyl)-[1,1'-biphenyl]-4-amine (CAS 1824678-59-2) was vacuum deposited on the HTL, to form an electron blocking layer (EBL) having a thickness of 5 nm.

Then, 97 vol.-% H09 (Sun Fine Chemicals, South Korea) as EML host and 3 vol.-% BD200 (Sun Fine Chemicals, South Korea) as fluorescent blue dopant were deposited on the EBL, to form a blue-emitting EML with a thickness of 20 nm.

Then the auxiliary ETL was formed with a thickness of 5 nm by depositing 2-(3'-(9,9-dimethyl-9H-fluoren-2-yl)-[1,1'-biphenyl]-3-yl)-4,6-diphenyl-1,3,5-triazine (CAS 1955543-57-3) on the emission layer (EML).

Then, the electron transporting layer was formed on the auxiliary electron transport layer according to Example 2 to Example 6 with a the thickness of 31 nm, see Table 5.

Then, the electron injection layer was formed on the electron transporting layer by deposing Yb with a thickness of 2 nm.

Then, Mg:Ag alloy (90:10 vol.-%) was evaporated at a rate of 0.01 to 1 Å/s at 10-7 mbar to form a cathode with a thickness of 13 nm.

A cap layer of Biphenyl-4-yl(9,9-diphenyl-9H-fluoren-2-yl)-[4-(9-phenyl-9H-carbazol-3-yl)phenyl]-amine was formed on the cathode with a thickness of 75 nm.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured at 20° C. The current-voltage characteristic is determined using a Keithley 2635 source measure unit, by sourcing a voltage in V and measuring the current in mA flowing through the device under test. The voltage applied to the device is varied in steps of 0.1V in the range between 0V and 10V. Likewise, the luminance-voltage characteristics and CIE coordinates are determined by measuring the luminance in $cd/m^2$ using an Instrument Systems CAS-140CT array spectrometer for each of the voltage values. The cd/A efficiency at 10 $mA/cm^2$ is determined by interpolating the luminance-voltage and current-voltage characteristics, respectively.

Lifetime LT of the device is measured at ambient conditions (20° C.) and 30 $mA/cm^2$, using a Keithley 2400 sourcemeter, and recorded in hours.

The brightness of the device is measured using a calibrated photo diode. The lifetime LT is defined as the time till the brightness of the device is reduced to 97% of its initial value.

The light output in external efficiency EQE and power efficiency (lm/W efficiency) are determined at 10 $mA/cm^2$ for top emission devices.

To determine the efficiency EQE in % the light output of the device is measured using a calibrated photodiode.

To determine the power efficiency in lm/W, in a first step the luminance in candela per square meter ($cd/m^2$) is measured with an array spectrometer CAS140 CT from Instrument Systems which has been calibrated by Deutsche Akkreditierungsstelle (DAkkS). In a second step, the luminance is then multiplied by x and divided by the voltage and current density.

TABLE 1

Examples of first organic compounds

| Referred to as: | Chemical formula | Molecular weight (g/mol) | Dipole moment (Debye) | mp (° C.) | Tg (° C.) | $T_{RO}$ (° C.) |
|---|---|---|---|---|---|---|
| OC-1 | | 658.83 | 1.21 | 262 | 135 | 228 |
| OC-2 | | 658.83 | 1.02 | n.o.[1)] | 129 | 216 |
| OC-3 | | 582.75 | 0.19 | 338 | 140 | 230 |
| OC-4 | | 689.84 | 0.57 | 280 | 138 | 211 |

TABLE 1-continued
Examples of first organic compounds
| Referred to as: | Chemical formula | Molecular weight (g/mol) | Dipole moment (Debye) | mp (° C.) | Tg (° C.) | $T_{RO}$ (° C.) |
|---|---|---|---|---|---|---|
| OC-5 | 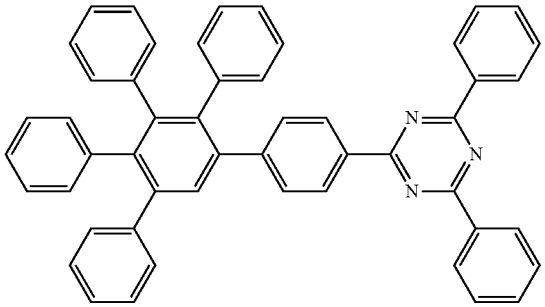 [SMILES: c1ccc(-c2nc(-c3ccccc3)nc(-c3ccc(-c4cc(-c5ccccc5)c(-c5ccccc5)c(-c5ccccc5)c4-c4ccccc4)cc3)n2)cc1] | 689.84 | 0.92 | 268 | 149 | 221 |
| OC-6 | 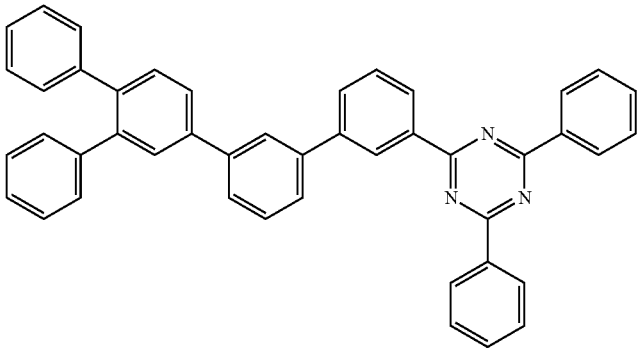 [SMILES: c1ccc(-c2nc(-c3ccccc3)nc(-c3cccc(-c4cccc(-c5ccc(-c6ccccc6)c(-c6ccccc6)c5)c4)c3)n2)cc1] | 613.76 | 0.26 | n.o. | 92 | 228 |
| OC-7 | 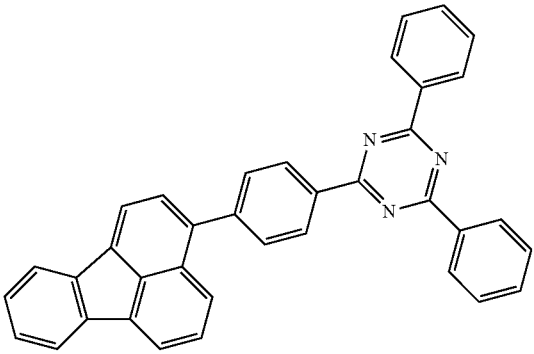 [SMILES: c1ccc(-c2nc(-c3ccccc3)nc(-c3ccc(-c4ccc5c6c(cccc46)-c4ccccc4-5)cc3)n2)cc1] | 509.6 | 0.19 | 254 | 100 | 217 |
| OC-8 | 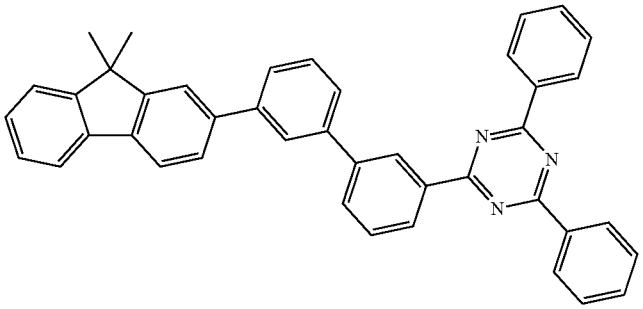 [SMILES: CC1(C)c2ccccc2-c2ccc(-c3cccc(-c4cccc(-c5nc(-c6ccccc6)nc(-c6ccccc6)n5)c4)c3)cc21] | 577.73 | 0.31 | n.o. | 95 | 220 |

TABLE 1-continued
Examples of first organic compounds
| Referred to as: | Chemical formula | Molecular weight (g/mol) | Dipole moment (Debye) | mp (° C.) | Tg (° C.) | $T_{RO}$ (° C.) |
|---|---|---|---|---|---|---|
| OC-9 | 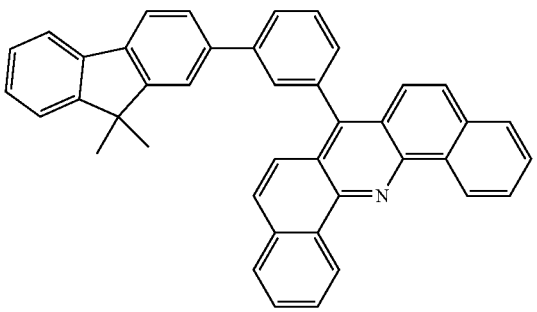 [SMILES: CC1(C)c2ccccc2-c2ccc(-c3cccc(-c4c5ccc6ccccc6c5nc5c4ccc4ccccc45)c3)cc21] | 625.81 | 1.77 | n.o. | 126 | 212 |
| OC-10 | 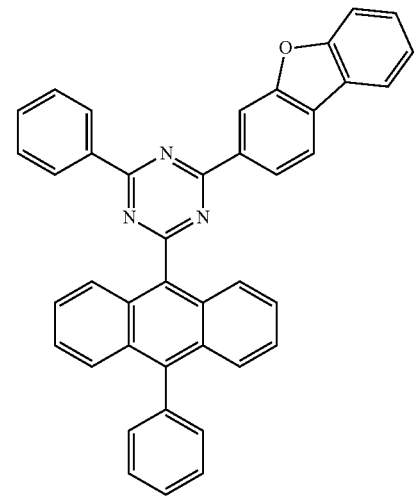 [SMILES: c1ccc(-c2nc(-c3ccc4c(c3)oc3ccccc34)nc(-c3c4ccccc4c(-c4ccccc4)c4ccccc34)n2)cc1] | 575.67 | 0.78 | 273 | 145 | 224 |
| OC-11 | 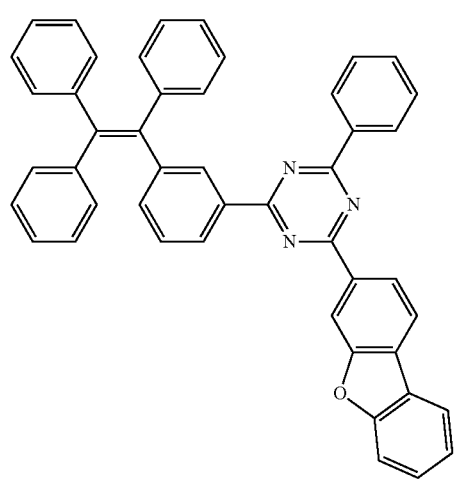 [SMILES: c1ccc(C(=C(c2ccccc2)c2cccc(-c3nc(-c4ccccc4)nc(-c4ccc5c(c4)oc4ccccc45)n3)c2)c2ccccc2)cc1] | 653.78 | 0.7 | 227 | 116 | 230 |

TABLE 1-continued

Examples of first organic compounds

| Referred to as: | Chemical formula | Molecular weight (g/mol) | Dipole moment (Debye) | mp (° C.) | Tg (° C.) | $T_{RO}$ (° C.) |
|---|---|---|---|---|---|---|
| OC-12 | | 669.84 | 1.13 | 252 | 126 | 237 |
| OC-13 | | 619.79 | 0.31 | 285 | 124 | 214 |
| OC-14 | | 605.76 | 1.06 | n.o. | 117 | 230 |

TABLE 1-continued

Examples of first organic compounds

| Referred to as: | Chemical formula | Molecular weight (g/mol) | Dipole moment (Debye) | mp (° C.) | Tg (° C.) | $T_{RO}$ (° C.) |
|---|---|---|---|---|---|---|
| OC-15 | | 605.76 | 0.17 | 266 | 138 | 220 |
| OC-16 | | 550.66 | 0.68 | n.d.[2)] | 105 | 218 |
| OC-17 | | 420.50 | 0.77 | 249 | n.d. | n.d. |

[1)]not observed. [2)]not determined.

TABLE 2

Examples of first compositions

| Referred to as: | First organic compound | Concentration of first organic compound in first composition [wt.-%] | Metal borate compound | Concentration of metal borate compound in first composition [wt.-%] |
|---|---|---|---|---|
| C-1 | OC-2 | 50 | Li-1 | 50 |
| C-2 | OC-17 | 50 | Li-2 | 50 |
| C-3 | OC-5 | 50 | Li-1 | 50 |

TABLE 3

Examples of second organic compounds

| Referred to as: | Second organic compound | Dipole moment (Debye) |
|---|---|---|
| ETM-1 | (structure) | 4.62 |
| ETM-2 | (structure) | 4.47 |

Stability of the First Composition Over Time

Figure 4:
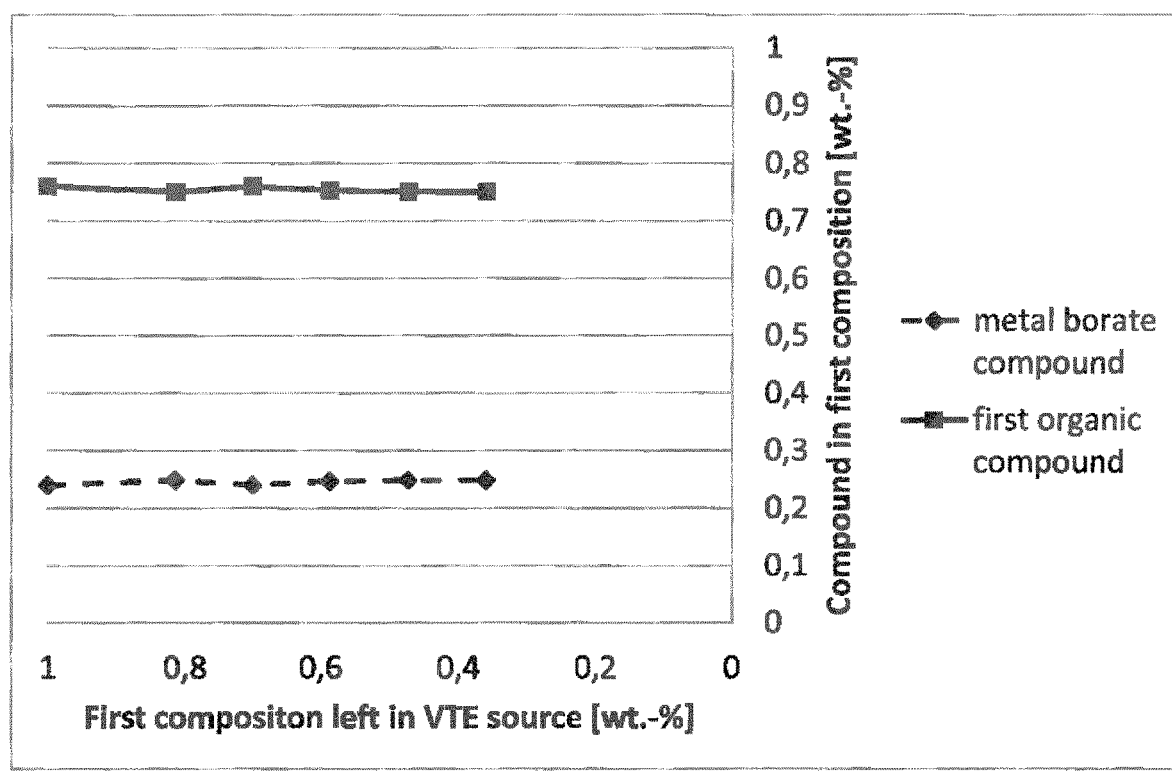
FIG. 4 shows a graph wherein the amount of first composition left in the VTE source in wt.-% is plotted against the concentration of compound in the first composition in wt.-%.

To check the stability of the first composition over time, a first composition consisting of 75 wt.-% first organic compound and 25 wt.-% metal borate compound was loaded into a VTE source and evaporated at 10-5 to 10-7 mbar until 64 wt.-% of the content of the VTE source had been evaporated. As can be seen in FIG. 4, the ratio of first organic compound (full line) to metal borate compound (dotted line) does not change significantly over time.

TABLE 4

Operating voltage of electron-only devices comprising a layer stack comprising organic semiconducting layers comprising a first composition compared to the state of the art

| | First composition | Concentration of first composition [vol.-%] | Second organic compound | Concentration of second organic compound [vol.-%] | Composition of the second organic semiconducting layer | Thickness of the second organic semiconducting layer [nm] | Operating voltage at 15 mA/cm$^2$ [V] |
|---|---|---|---|---|---|---|---|
| Comparative example 1 | Li-1 | 70 | ETM-1 | 30 | Li-1 | 0 | 0.3 |
| | | | | | | 1 | 0.4 |
| | | | | | | 2 | 1.5 |
| | | | | | | 3 | 3.7 |
| Example 1 | C-1 | 50 | ETM-1 | 50 | C-1 | 0 | 0.5 |
| | | | | | | 1 | 0.1 |
| | | | | | | 2 | 0.3 |
| | | | | | | 3 | 0.5 |

TABLE 5

Performance of an organic electroluminescent device comprising an electron transport layer comprising the first composition

| | First composition | Concentration of first composition (vol.-%) | Second organic compound | Concentration of second organic compound (vol.-%) | Thickness electron transport layer (nm) | Operating voltage at 10 mA/cm² (V) | cd/A efficiency at 10 mA/cm² (cd/A) | LT97 at 30 mA/cm² (h) |
|---|---|---|---|---|---|---|---|---|
| Example 2 | C-2 | 50 | ETM-1 | 50 | 31 | 3.7 | 7.1 | 93 |
| Example 3 | C-2 | 50 | ETM-2 | 50 | 31 | 3.8 | 7.5 | 69 |
| Example 4 | C-1 | 50 | ETM-1 | 50 | 31 | 3.7 | 7.6 | 60 |
| Example 5 | C-1 | 30 | ETM-1 | 70 | 31 | 3.6 | 7.6 | 53 |
| Example 6 | C-1 | 50 | ETM-2 | 50 | 31 | 3.8 | 7.4 | 65 |

Technical Effect of the Invention

In Table 4 is shown the operating voltage of EOD, wherein the second organic semiconducting layer has a thickness of 0 to 3 nm.

In comparative example 1, the first and third organic semiconducting layer comprise a second organic compound and metal borate compound Li-1. The second organic semiconducting layer consists of metal borate compound Li-1. The operating voltage increases with increased thickness of the second organic semiconducting layer. At 0 nm, the operating voltage is 0.3 Volt and at 3 nm the operating voltage is 3.7 V, see Table 4.

In example 1, the first and third organic semiconducting layer comprise a second organic compound and a first composition C-1. The second organic semiconducting layer consists of first composition C-1. At 0 nm, the operating voltage is 0.5 Volt. The operating voltage is comparable to comparative example 1. At 3 nm, the operating voltage is 0.5 V. Thereby, the operating voltage of devices comprising an organic semiconducting layer according to invention is substantially lower than in comparative example 1.

The operating voltage is an indication for conductivity of a semiconducting layer. The higher the conductivity the lower is the operating voltage.

In summary, an organic semiconducting layer prepared by the method according to invention has much improved conductivity compared to the state of the art.

In Table 5 is shown the performance of OLEDs comprising an organic semiconducting layer prepared according to invention.

As can be seen in Example 2 to 6, very good operating voltage, cd/A efficiency and lifetime can be obtained when the organic semiconducting layer is prepared according to invention.

In summary, an organic electronic device comprising an organic semiconducting layer prepared by the method according to invention shows very good performance, in particular operating voltage, cd/A efficiency and/or lifetime.

The features disclosed in the foregoing description and in the dependent claims may, both separately and in any combination thereof, be material for realizing the aspects of the disclosure made in the independent claims, in diverse forms thereof.

The invention claimed is:

1. Method for preparing an organic semiconducting layer comprising the steps:
a) providing a first composition in a first vacuum thermal evaporation source, the first composition comprising
aa) a first organic compound, the first organic compound comprising at least one unsubstituted or substituted $C_{10}$ to $C_{30}$ condensed aryl group and/or at least one unsubstituted or substituted $C_3$ to $C_{30}$ heteroaryl group, wherein the one or more substituent(s) if present, are independently selected from the group consisting of (i) deuterium, (ii) a halogen, (iii) a $C_1$ to $C_{22}$ silyl group, (iv) a $C_1$ to $C_{30}$ alkyl group, (v) a $C_1$ to $C_{10}$ alkylsilyl group, (vi) a $C_6$ to $C_{22}$ arylsilyl group, (vii) a $C_3$ to $C_{30}$ cycloalkyl group, (viii) a $C_2$ to $C_{30}$ heterocycloalkyl group, (ix) a $C_0$ to $C_{30}$ aryl group, (x) a $C_2$ to $C_{30}$ heteroaryl group, (xi) a $C_1$ to $C_{30}$ perfluoro-hydrocarbyl group, and (xii) a $C_1$ to $C_{10}$ trifluoroalkyl group,
wherein the first organic compound has
i) a dipole moment in the range of $\geq 0$ and $\leq 2$ Debye; and
ii) a molecular weight of the chemical formula (in g/mol) in the range of $\geq 400$ and $\leq 1,800$; and
bb) a metal borate compound;
b) transferring the first composition from the solid phase into the gas phase in a vacuum chamber; and
c) depositing the first composition to form the organic semiconducting layer.

2. Method according to claim 1, wherein the first organic compound comprises at least one group selected from $C_{10}$ to $C_{24}$ condensed aryl group, and/or a $C_3$ to $C_{24}$ heteroaryl group.

3. Method according to claim 1, wherein the heteroaryl group comprises one to three heteroatoms independently selected from N, O or S.

4. Method according to claim 1, wherein the first organic compound further comprises a group selected from substituted or unsubstituted spiro[fluorene-9,9'-xanthene]-yl, substituted or unsubstituted 9,9'-dimethylfluorenyl, substituted or unsubstituted 9,9'-diphenylfluorenyl, 9,9'-spiro[bifluorene]-yl, substituted or unsubstituted naphthyl, substituted or unsubstituted phenanthrenyl, substituted or unsubstituted fluoranthenyl, a substituted or unsubstituted group consisting of 3 to 6 connected phenyl rings or substituted or unsubstituted tetraphenylethenyl.

5. Method according to claim 1, wherein the first organic compound is represented by the Formula 1a

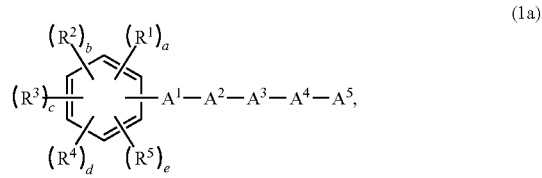

(1a)

wherein
$A^1$, $A^2$, $A^3$ and $A^4$ are independently selected from a single bond, a substituted or unsubstituted $C_6$ to $C_{18}$ arylene or substituted or unsubstituted $C_1$ to $C_{18}$ heteroarylene;

$A^5$ is selected from unsubstituted or substituted $C_{10}$-$C_{30}$ condensed aryl or from unsubstituted or substituted $C_3$-$C_{30}$ heteroaryl;

$R^1$ to $R^5$ are independently selected from substituted or unsubstituted phenyl;

a) to e) are independently selected as 0 or 1 with the provision that $2 \leq a+b+c+d+e \leq 5$;

wherein in the Formula 1a, the one or more substituent(s), if present, are independently selected from
(i) deuterium,
(ii) a halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_6$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_0$ to $C_{30}$ aryl group,
(x) a $C_2$ to $C_{30}$ heteroaryl group,
(xi) a $C_1$ to $C_{30}$ perfluoro-hydrocarbyl group, or
(xii) a $C_1$ to $C_{10}$ trifluoroalkyl group;
and/or the first organic compound is represented by Formula 1b

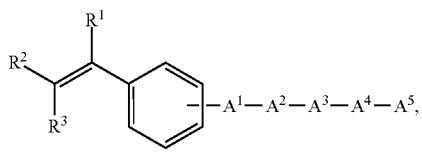

(1b)

wherein $A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;

$A^5$ is selected from unsubstituted or substituted $C_{10}$ to $C_{30}$ condensed aryl or from unsubstituted or substituted $C_3$ to $C_{30}$ heteroaryl;

$R^1$ to $R^3$ are independently selected from substituted or unsubstituted phenyl;

wherein in Formula 1b, the one or more substituent(s), if present, are independently selected from the group consisting of
(i) deuterium,
(ii) a halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_6$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_6$ to $C_{30}$ aryl group,
(x) a $C_2$ to $C_{30}$ heteroaryl group,
(xi) a $C_1$ to $C_{30}$ perfluoro-hydrocarbyl group,
(xii) a $C_1$ to $C_{10}$ trifluoroalkyl group;
and/or the first organic compound may be represented by Formula 1c

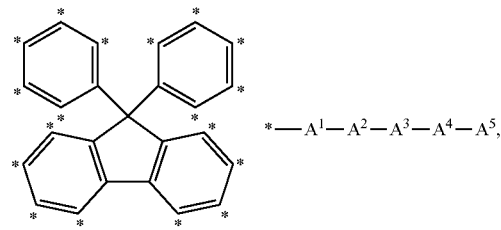

(1c)

wherein the compound of formula (1c) comprises one moiety-$A^1$-$A^2$-$A^3$-$A^4$-$A^5$, wherein the asterisk symbol "*" marks the possible binding positions of the moiety-$A^1$-$A^2$-$A^3$-$A^4$-$A^5$ to the remaining structure;

$A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;

$A^5$ is selected from unsubstituted or substituted $C_{10}$ to $C_{30}$ condensed aryl or from unsubstituted or substituted $C_3$ to $C_{30}$ heteroaryl;

wherein in Formula 1c, the one or more substituent(s), if present, are independently selected from the group consisting of
(i) deuterium,
(ii) halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_6$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_0$ to $C_{30}$ aryl group,
(x) a $C_2$ to $C_{30}$ heteroaryl group,
(xi) a $C_1$ to $C_{30}$ perfluoro-hydrocarbyl group,
(xii) a $C_1$ to $C_{10}$ trifluoroalkyl group;
and/or the first organic compound may be represented by Formula 1d

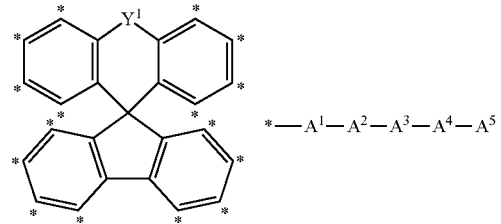

(1d)

wherein the compound of formula (1d) comprises one moiety-$A^1$-$A^2$-$A^3$-$A^4$-$A^5$, wherein the asterisk symbol "*" marks the possible binding positions of the moiety-$A^1$-$A^2$-$A^3$-$A^4$-$A^5$ to the remaining structure;

$Y^1$ is selected from a single bond, O, S, $CR_2$ or $SiR_2$, wherein R is independently selected from $C_1$ to $C_{12}$ alkyl or $C_0$ to $C_{18}$ aryl;

$A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;

$A^5$ is selected from unsubstituted or substituted $C_{10}$ to $C_{30}$ condensed aryl or from unsubstituted or substituted $C_3$ to $C_{30}$ heteroaryl;

wherein in Formula 1d, the one or more substituent(s), if present, are independently selected from the group consisting of
(i) deuterium,
(ii) halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_6$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_6$ to $C_{30}$ aryl group,
(x) a $C_2$ to $C_{30}$ heteroaryl group,
(xi) a $C_1$ to $C_{30}$ perfluoro-hydrocarbyl group,
(xii) a $C_1$ to $C_{10}$ trifluoroalkyl group.

6. Method according to claim 1, wherein the metal borate compound is an alkali metal borate, an alkaline earth metal borate or a rare earth metal borate having a molecular weight of the chemical formula (in g/mol) in the range of ≥100 to ≤1,200.

7. Method according to claim 1, wherein the metal borate compound has the following Formula 2

(2)

wherein M is a metal ion, each of $A^6$ to $A^9$ is independently selected from H, substituted or unsubstituted $C_6$-$C_{20}$ aryl and substituted or unsubstituted $C_2$-$C_{20}$ heteroaryl and n is valency of the metal ion.

8. Method according to claim 1, further comprising the steps of
e) providing a second organic compound in a second vacuum thermal evaporation source;
f) transferring the second organic compound from the solid phase into the gas phase in the vacuum chamber; and
g) depositing the first composition together with the second organic compound to form the organic semiconducting layer.

9. Method according to claim 8, wherein the second organic compound has a dipole moment in the range of ≥1.5 Debye and ≤10 Debye; and a molecular weight of the chemical formula (in g/mol) in the range of ≥400 and ≤1,800.

10. Method according to claim 8, wherein the second organic compound comprises at least one group selected from phenanthroline; benzimidazole; pyridine-4-yl; pyrimidine; quinoline; benzoquinoline; dibenzoquinoline; quinoxaline; benzoquinoxaline; dibenzoquinaxoline; xanthene; C=O; COOR, wherein R is selected from $C_1$-$C_{12}$ alkyl or $C_6$-$C_{18}$ aryl; and from P=X, wherein X is selected from O, S or Se.

11. Organic electronic device comprising an anode, a cathode and an organic semiconducting layer obtainable by a method for preparing the organic semiconducting layer comprising the steps:
a) providing a first composition in a first vacuum thermal evaporation source, the first composition comprising
aa) a first organic compound, the first organic compound comprising at least one unsubstituted or substituted $C_{10}$ to $C_{30}$ condensed aryl group and/or at least one unsubstituted or substituted $C_3$ to $C_{30}$ heteroaryl group, wherein the one or more substituent(s) if present, are independently selected from the group consisting of (i) deuterium, (ii) a halogen, (iii) a $C_1$ to $C_{22}$ silyl group, (iv) a $C_1$ to $C_{30}$ alkyl group, (v) a $C_1$ to $C_{10}$ alkylsilyl group, (vi) a $C_6$ to $C_{22}$ arylsilyl group, (vii) a $C_3$ to $C_{30}$ cycloalkyl group, (viii) a $C_2$ to $C_{30}$ heterocycloalkyl group, (ix) a $C_0$ to $C_{30}$ aryl group, (x) a $C_2$ to $C_{30}$ heteroaryl group, (xi) a $C_1$ to $C_{30}$ perfluoro-hydrocarbyl group, and (xii) a $C_1$ to $C_{10}$ trifluoroalkyl group,
wherein the first organic compound has
i) a dipole moment in the range of >0 and <2 Debye; and
ii) a molecular weight of the chemical formula (in g/mol) in the range of >400 and <1,800; and
bb) a metal borate compound;
b) transferring the first composition from the solid phase into the gas phase in a vacuum chamber; and
c) depositing the first composition to form the organic semiconducting layer.

12. Organic electronic device according to claim 11, wherein the first organic compound comprises at least one group selected from $C_{10}$ to $C_{24}$ condensed aryl group, and/or a $C_3$ to $C_{24}$ heteroaryl group.

13. Organic electronic device according to claim 11, wherein the heteroaryl group comprises one to three heteroatoms independently selected from N, O or S.

14. Organic electronic device according to claim 11, wherein the first organic compound further comprises a group selected from substituted or unsubstituted spiro[fluorene-9,9'-xanthene]-yl, substituted or unsubstituted 9,9'-dimethylfluorenyl, substituted or unsubstituted 9,9'-diphenylfluorenyl, 9,9'-spiro[bifluorene]-yl, substituted or unsubstituted naphthyl, substituted or unsubstituted phenanthrenyl, substituted or unsubstituted fluoranthenyl, a substituted or unsubstituted group consisting of 3 to 6 connected phenyl rings or substituted or unsubstituted tetraphenylethenyl.

15. Organic electronic device according to claim 11, wherein the first organic compound is represented by the Formula 1a

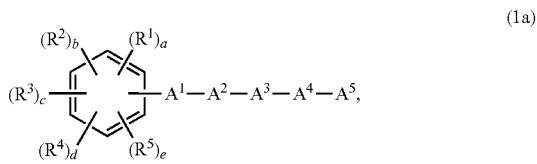

(1a)

wherein
$A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;

$A^5$ is selected from unsubstituted or substituted $C_{10}$-$C_{30}$ condensed aryl or from unsubstituted or substituted $C_3$-$C_{30}$ heteroaryl;

$R^1$ to $R^5$ are independently selected from substituted or unsubstituted phenyl;

a) to e) are independently selected as 0 or 1 with the provision that $2 \leq a+b+c+d+e \leq 5$;

wherein in the Formula 1a, the one or more substituent(s), if present, are independently selected from (i) deuterium,
(ii) a halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_0$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_0$ to $C_{30}$ aryl group,
(x) a $C_2$ to $C_{30}$ heteroaryl group,
(xi) a $C_1$ to $C_{30}$ perfluoro-hydrocarbyl group, or
(xii) a $C_1$ to $C_{10}$ trifluoroalkyl group;

and/or the first organic compound is represented by Formula 1b

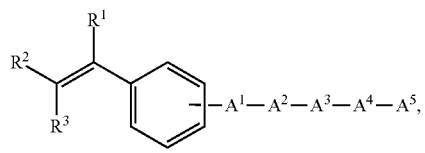

(1b)

wherein $A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;

$A^5$ is selected from unsubstituted or substituted $C_{10}$ to $C_{30}$ condensed aryl or from unsubstituted or substituted $C_3$ to $C_{30}$ heteroaryl;

$R^1$ to $R^3$ are independently selected from substituted or unsubstituted phenyl;

wherein in Formula 1b, the one or more substituent(s), if present, are independently selected from the group consisting of (i) deuterium,
(ii) a halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_6$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_0$ to $C_{30}$ aryl group,
(x) a $C_2$ to $C_{30}$ heteroaryl group,
(xi) a $C_1$ to $C_{30}$ perfluoro-hydrocarbyl group,
(xii) a $C_1$ to $C_{10}$ trifluoroalkyl group;

and/or the first organic compound may be represented by Formula 1c

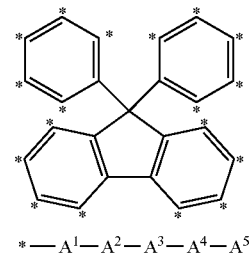

(1c)

wherein the compound of formula (1c) comprises one moiety-$A^1$-$A^2$-$A^3$-$A^4$-$A^5$, wherein the asterisk symbol "*" marks the possible binding positions of the moiety-$A^1$-$A^2$-$A^3$-$A^4$-$A^5$ to the remaining structure;

$A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;

$A^5$ is selected from unsubstituted or substituted $C_{10}$ to $C_{30}$ condensed aryl or from unsubstituted or substituted $C_3$ to $C_{30}$ heteroaryl;

wherein in Formula 1c, the one or more substituent(s), if present, are independently selected from the group consisting of (i) deuterium,
(ii) halogen,
(iii) a $C_1$ to $C_{22}$ silyl group,
(iv) a $C_1$ to $C_{30}$ alkyl group,
(v) a $C_1$ to $C_{10}$ alkylsilyl group,
(vi) a $C_0$ to $C_{22}$ arylsilyl group,
(vii) a $C_3$ to $C_{30}$ cycloalkyl group,
(viii) a $C_2$ to $C_{30}$ heterocycloalkyl group,
(ix) a $C_0$ to $C_{30}$ aryl group,
(x) a $C_2$ to $C_{30}$ heteroaryl group,
(xi) a $C_1$ to $C_{30}$ perfluoro-hydrocarbyl group,
(xii) a $C_1$ to $C_{10}$ trifluoroalkyl group;

and/or the first organic compound may be represented by Formula 1d

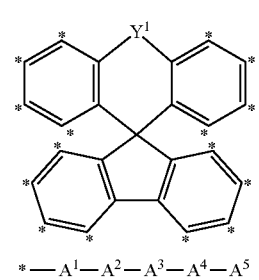

(1d)

wherein the compound of formula (1d) comprises one moiety-$A^1$-$A^2$-$A^3$-$A^4$-$A^5$, wherein the asterisk symbol "*" marks the possible binding positions of the moiety-$A^1$-$A^2$-$A^3$-$A^4$-$A^5$ to the remaining structure;

$Y^1$ is selected from a single bond, O, S, $CR_2$ or $SiR_2$, wherein R is independently selected from $C_1$ to $C_{12}$ alkyl or $C_6$ to $C_{18}$ aryl;

$A^1$, $A^2$, $A^3$ and $A^4$ are independently selected from a single bond, a substituted or unsubstituted $C_6$ to $C_{18}$ arylene or unsubstituted or substituted $C_1$ to $C_{18}$ heteroarylene;

$A^5$ is selected from unsubstituted or substituted $C_{10}$ to $C_{30}$ condensed aryl or from unsubstituted or substituted $C_3$ to $C_{30}$ heteroaryl;

wherein in Formula 1d, the one or more substituent(s), if present, are independently selected from the group consisting of (i) deuterium, (ii) halogen, (iii) a $C_1$ to $C_{22}$ silyl group, (iv) a $C_1$ to $C_{30}$ alkyl group, (v) a $C_1$ to $C_{10}$ alkylsilyl group, (vi) a $C_6$ to $C_{22}$ arylsilyl group, (vii) a $C_3$ to $C_{30}$ cycloalkyl group, (viii) a $C_2$ to $C_{30}$ heterocycloalkyl group, (ix) a $C_6$ to $C_{30}$ aryl group, (x) a $C_2$ to $C_{30}$ heteroaryl group, (xi) a $C_1$ to $C_{30}$ perfluoro-hydrocarbyl group, (xii) a $C_1$ to $C_{10}$ trifluoroalkyl group.

16. Organic electronic device according to claim 11, wherein the metal borate compound has a molecular weight of the chemical formula (in g/mol) in the range of ≥100 to ≤1,200 and is an alkali metal borate, an alkaline earth metal borate or a rare earth metal borate.

17. Organic electronic device according to claim 11, wherein the metal borate compound has the following Formula 2

(2)

wherein M is a metal ion, each of $A^6$ to $A^9$ is independently selected from H, substituted or unsubstituted $C_6$-$C_{20}$ aryl and substituted or unsubstituted $C_2$-$C_{20}$ heteroaryl and n is valency of the metal ion.

18. Organic electronic device according to claim 11, wherein the method for preparing the organic semiconducting layer further comprises the steps of d) providing a second organic compound in a second vacuum thermal evaporation source;

e) transferring the second organic compound from the solid phase into the gas phase in the vacuum chamber; and f) depositing the first composition together with the second organic compound to form the organic semiconducting layer.

19. Organic electronic device according to claim 18, wherein the second organic compound has a dipole moment in the range of ≥1.5 Debye and ≤10 Debye; and a molecular weight of the chemical formula (in g/mol) in the range of ≥400 and ≤1,800.

20. Organic electronic device according to claim 18, wherein the second organic compound comprises at least one group selected from phenanthroline; benzimidazole; pyridine-4-yl; pyrimidine; quinoline; benzoquinoline; dibenzoquinoline; quinoxaline; benzoquinoxaline; dibenzoquinaxoline; xanthene; C=O; COOR, wherein R is selected from $C_1$-$C_{12}$ alkyl or $C_6$-$C_{18}$ aryl; and from wherein X is selected from O, S or Se.

* * * * *